United States Patent
Furusawa et al.

(10) Patent No.: US 8,203,210 B2
(45) Date of Patent: Jun. 19, 2012

(54) SEMICONDUCTOR DEVICE HAVING METAL CONTACTS FORMED IN AN INTERLAYER DIELECTRIC FILM COMPRISING FOUR SILICON-CONTAINING LAYERS

(75) Inventors: Takeshi Furusawa, Tokyo (JP); Takao Kamoshima, Tokyo (JP); Masatsugu Amishiro, Tokyo (JP); Naohito Suzumura, Tokyo (JP); Shoichi Fukui, Tokyo (JP); Masakazu Okada, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/883,031

(22) Filed: Sep. 15, 2010

(65) Prior Publication Data

US 2011/0001246 A1 Jan. 6, 2011

Related U.S. Application Data

(63) Continuation of application No. 12/014,078, filed on Jan. 14, 2008, now abandoned.

(30) Foreign Application Priority Data

Mar. 22, 2007 (JP) ................................. 2007-074266

(51) Int. Cl.
*H01L 23/48* (2006.01)
(52) U.S. Cl. ................ 257/760; 257/759; 257/E23.019; 257/E23.145
(58) Field of Classification Search .................. 257/748, 257/758, 760, 759
See application file for complete search history.

(56) References Cited

U.S. PATENT DOCUMENTS 5,926,732 A 7/1999 Matsuura
6,326,301 B1 12/2001 Venkatesan et al.
(Continued)

FOREIGN PATENT DOCUMENTS

CN 1536660 A 10/2004
(Continued)

OTHER PUBLICATIONS

T. Oshima et al., "Suppression of Stress-Induced Voiding in Copper Interconnects," Proceedings IEEE International Electron Devices Meeting (IEDM), 2002, pp. 757-760.

*Primary Examiner* — Anh Mai
(74) *Attorney, Agent, or Firm* — Miles & Stockbridge P.C.

(57) ABSTRACT

The reliability of a semiconductor device having an embedded wire in the lowest layer wire is improved. In a main surface of a semiconductor substrate, MISFETs are formed and over the main surface, insulating films 10, 11 are formed. In the insulating films 10, 11 a contact hole is formed and a plug is embedded therein. Over the insulating film 11 in which the plug is embedded, insulating films 14, 15, 16 are formed and an opening is formed in the insulating films 14, 15, 16 and a wire is embedded therein. The insulating film 15 is an etching stopper film when etching the insulating film 16 in order to form the opening, containing silicon and carbon. The insulating film 11 has a high hygroscopicity and the insulating film 15 has a low moisture resistance, however, by interposing the insulating film 14 therebetween and making the insulating film 14 have a higher density of the number of Si (silicon) atoms than that of the insulating film 11, an electrically weak interface is prevented from being formed.

25 Claims, 13 Drawing Sheets

U.S. PATENT DOCUMENTS

| | | | |
|---|---|---|---|
| 7,176,121 B2 * | 2/2007 | Ohmori et al. | 438/624 |
| 7,180,191 B2 | 2/2007 | Sasaki et al. | |
| 8,012,871 B2 * | 9/2011 | Ohmori et al. | 438/624 |
| 2001/0054765 A1 * | 12/2001 | Ohto et al. | 257/751 |
| 2003/0087513 A1 * | 5/2003 | Noguchi et al. | 438/627 |
| 2004/0227242 A1 | 11/2004 | Noguchi et al. | |
| 2005/0176202 A1 | 8/2005 | Hisamoto et al. | |
| 2011/0266679 A1 * | 11/2011 | Hotta et al. | 257/758 |

FOREIGN PATENT DOCUMENTS

| | | |
|---|---|---|
| JP | 2005-136152 A | 5/2005 |
| JP | 2005-223021 A | 8/2005 |

\* cited by examiner

SEMICONDUCTOR DEVICE HAVING METAL CONTACTS FORMED IN AN INTERLAYER DIELECTRIC FILM COMPRISING FOUR SILICON-CONTAINING LAYERS

CROSS-REFERENCE TO RELATED APPLICATION

This application is a continuation of application Ser. No. 12/014,078 filed Jan. 14, 2008 (now abandoned). The present application also claims priority from Japanese patent application No. 2007-74266 filed on Mar. 22, 2007, the content of which is hereby incorporated by reference into this application.

BACKGROUND OF THE INVENTION

The present invention relates to a semiconductor device and a manufacturing technique of the same and more particularly to a technique that is useful for the semiconductor device having an embedded wire and manufacturing method of the same.

Elements of a semiconductor device are coupled by, for example, a multilayer wire structure to form circuits. As miniaturization advances, an embedded wire structure has been developed as a wire structure. An embedded wire structure is formed by, for example, embedding a wire material in a wire opening, such as wire groove or hole formed in an insulating film, using the Damascene technique (Single-Damascene technique and Dual-Damascene technique).

In Japanese patent laid-open No. 2005-136152, a technique is described, which forms a Damascene copper wire in a three-layer structure having an insulating film including a silicon nitride film, a silicon oxynitride film, a silicon carbide film or a silicon carbonitride film, an insulating film including an organic polymer base low dielectric constant insulating material thereover, and an insulating film including a silicon nitride film, a silicon carbide film, or a silicon carbonitride film thereover.

In Japanese patent laid-open No. 2005-223021, a technique is described, which controls the composition of carbon of a SiOC film in which the Damascene copper wire is formed.

SUMMARY OF THE INVENTION

The present inventors have examined and found the following.

After a semiconductor element such as MISFET is formed in the main surface of a semiconductor substrate, an interlayer insulating film is formed over the main surface of the semiconductor substrate. Recently, as miniaturization advances, the distance between gate electrodes of a MISFET becomes narrower and therefore it is desirable to use an insulating film with an excellent embeddability between gate electrodes etc. as the above interlayer insulating film.

While an insulating film formed by the plasma CVD method has an insufficient embeddability and there is the possibility that a void may occur because a narrow space between gate electrodes is not fully embedded, an insulating film, such as an $O_3$-TEOS oxide film, formed by the thermal CVD method, or an insulating film, such as an SOG (Spin-On Glass) film, formed by the coating method, has an excellent embeddability into a space between gate electrodes etc.

However, an insulating film with an excellent embeddability tends to become more hygroscopic (more likely to absorb moisture) compared to an insulating film formed by the plasma CVD method, and therefore, it is likely to have a high moisture content when formed.

It has been found that due to this, after a contact hole is formed in an interlayer insulating film, which is excellent in embeddability but tends to have a high moisture content, and a plug is embedded therein, if a wire is formed by further forming an insulating film over its upper layer using the Damascene technique, there is the possibility that the reliability of the wire may be reduced resulting from the high moisture content of the interlayer insulating film. In other words, it has been found from the examination of the present inventors that if an insulating film with a low moisture resistance is formed over an interlayer insulating film having a tendency to have a high moisture content, its interface becomes electrically weak and dielectric breakdown is likely to occur via the interface even if there is no diffusion of copper (Cu) in the copper wire.

An object of the present invention is to provide a technique capable of improving the reliability of a semiconductor device.

The above and further objects and novel features of the present invention will be apparent from the following detailed description in this specification and the accompanying drawings.

Representative inventions among the inventions that will be disclosed herein are briefly described below.

According to the present invention, there are provided a first insulating film formed over the main surface in which a semiconductor element of a semiconductor substrate is formed and having a contact hole and a plug embedded therein, second, third, and fourth insulating films formed over the first insulating film in order from the bottom, and a first wire embedded in a wire opening formed in the second, third, and fourth insulating films, wherein the second insulating film is made to have a higher density of the number of Si atoms than that of the first insulating film.

According to the present invention, there are provided a first insulating film formed over the main surface in which a semiconductor element of a semiconductor substrate is formed and having a contact hole and a plug embedded therein, second, third, and fourth insulating films formed over the first insulating film in order from the bottom, and a first wire embedded in a wire opening formed in the second, third, and fourth insulating films, wherein the second insulating film is formed by the plasma CVD method and the first insulating film is formed by the coating method or thermal CVD method.

According to the present invention, a first insulating film is formed over the main surface in which a semiconductor element of a semiconductor substrate is formed, a contact hole is formed in the first insulating film and a plug is embedded therein, a second insulating film with a higher density of the number of Si atoms than that of the first insulating film is formed over the first insulating film in which the plug is embedded, and third and fourth insulating films are formed in order over the second insulating film. Then, the fourth insulating film is etched using the third insulating film as an etching stopper and after the third and second insulating films are etched, a wire opening is formed in the second, third, and fourth insulating films and a first wire is formed in the wire opening.

According to the present invention, a first insulating film is formed over the main surface in which a semiconductor element of a semiconductor substrate is formed by the coating method or thermal CVD method, a contact hole is formed in the first insulating film and a plug is embedded therein, a second insulating film is formed by the plasma CVD method over the first insulating film in which the plug is embedded, and third and fourth insulating films are formed in order over the second insulating film. Then, the fourth insulating film is etched using the third insulating film as an etching stopper and after the third and second insulating films are etched, a wire opening is formed in the second, third, and fourth insulating films and a first wire is formed in the wire opening.

The effect obtained by representative inventions among the inventions is briefly described as follows.

It is possible to improve the reliability of a semiconductor device.

DETAILED DESCRIPTION OF THE PREFERRED EMBODIMENTS

Figure 1:
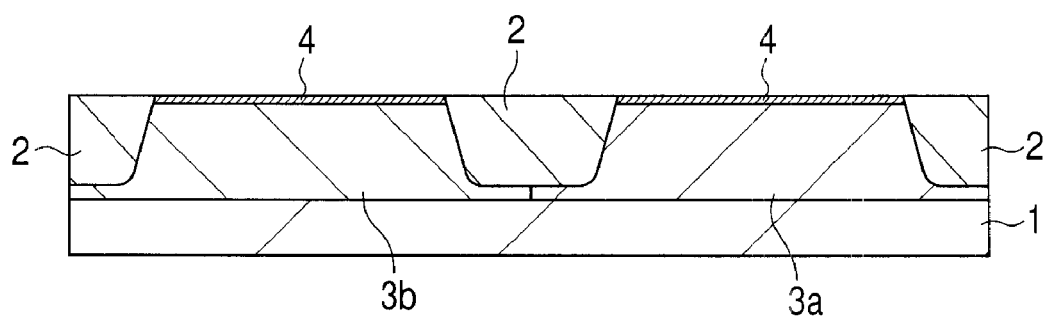
FIG. 1 is a cross-sectional view of essential parts in a manufacturing process of a semiconductor device according to an embodiment of the present invention.

In the following embodiments, when necessary for convenience, description is given by dividing the embodiment into a plurality of sections or embodiments, however, unless explicitly stated, they are not independent of one another, but one is related with the other part or the whole as a modification example, a detail, supplementary description, etc. In addition, in the following embodiments, when referred to the number of elements etc. (number of units, numerical value, quantity, range, etc., are included), unless stated explicitly or except when the number is obviously limited to specific numbers in principle, the number is not limited to the specific ones but may be more or less than the specific numbers. Further, in the following embodiments, it is needless to say that components (constituent steps etc. are also included) are not necessarily requisite unless stated explicitly or except when they are obviously requisite in principle. Similarly, in the following embodiments, when shapes, positions, relations, etc., of components etc. are referred to, unless stated explicitly or except when they can be thought otherwise in principle, those substantially the same or similar to the shapes etc. are also included. This applies to the above-mentioned numerical values and ranges.

Next, preferred embodiments of the present invention will be described in detail referring to the accompanying drawings. In all the drawings that illustrate the preferred embodiments, elements with like functions are designated by like reference numerals and repeated descriptions of such elements are omitted. In the following preferred embodiments, the description of the same or like parts is not repeated unless it is necessary.

In the drawings used in the embodiments, hatching may be omitted even from cross-sectional views in order to make them easier-to-see. On the contrary, hatching may be added even to plan views in order to make them easier-to-see.

First Embodiment

Semiconductor devices according to the preferred embodiments and their manufacturing process will be described with reference to the drawings. FIG. 1 to FIG. 14 are sectional views of essential parts in the manufacturing process of a semiconductor device according to an embodiment, for example, a semiconductor device having a MISFET (Metal Insulator Semiconductor Field Effect Transistor).

In order to manufacture a semiconductor device according to the present embodiment, first, a semiconductor substrate (semiconductor wafer) 1 including a p-type single crystal silicon etc. having a specific resistance of about, for example, 1 to 10 Ωcm is prepared. Then, an element isolation region 2 is formed in the main surface of the semiconductor substrate 1. The element isolation region 2 includes silicon oxide etc. and can be formed by, for example, the STI (Shallow Trench Isolation) method or the LOCOS (Local Oxidization of Silicon) method.

Next, a p-type well 3a is formed in a region in which an n-channel type MISFET of the semiconductor substrate 1 is formed, and an n-type well 3b is formed in a region in which a p-channel type MISFET of the semiconductor substrate 1 is formed. The p-type well 3a can be formed by, for example, ion implantation of p-type impurities, such as boron (B) etc., and the n-type well 3b can be formed by, for example, ion implantation of n-type impurities, such as phosphorus (P) or arsenic (As).

Next, a gate insulating film 4 is formed in the main surface (that is, the surface of the p-type well 3a and the n-type well 3b) of the semiconductor substrate 1. The gate insulating film 4 includes, for example, a thin silicon oxide film, and can be formed by, for example, the thermal oxidization method.

Figure 2:
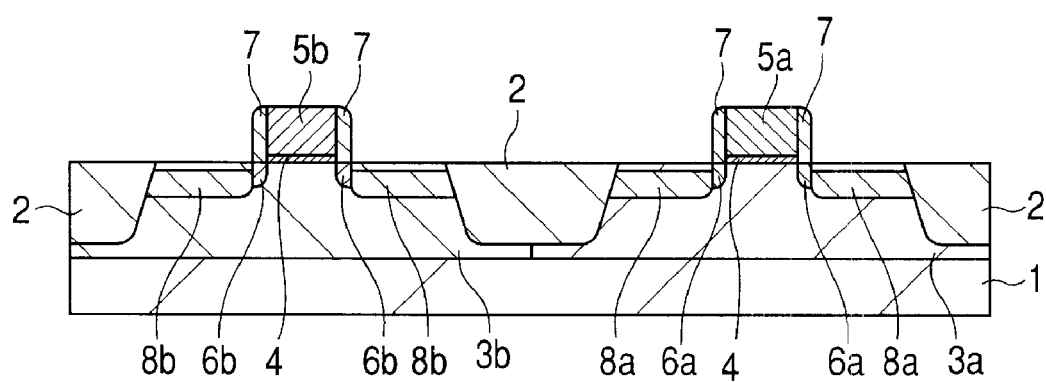
FIG. 2 is a cross-sectional view of essential parts in the manufacturing process of the semiconductor device, following FIG. 1.

Next, as shown in FIG. 2, a gate electrode 5a is formed on the gate insulating film 4 of the p-type well 3a and a gate electrode 5b is formed on the gate insulating film 4 of the n-type well 3b. The gate electrodes 5a, 5b include, for example, a polycrystal silicon film (doped polysilicon film) etc. In order to form the gate electrodes 5a, 5b, first, for example, a polycrystal silicon film is formed over the semiconductor substrate 1. Then, ions of n-type impurities, such as phosphorus (P), arsenic (As), etc., are implanted into the region in which the n-channel type MISFET of the polycrystal silicon film using a photoresist film (not shown) as a mask to form an n-type semiconductor film with a low resistance, and ions of p-type impurities, such as boron (B) etc., are implanted into the region in which the p-channel type MISFET of the polycrystal silicon film using another photoresist film (not shown) as a mask to form a p-type semiconductor film with a low resistance. Then, by patterning the polycrystal silicon film using the photolithography method and the dry etching method, the gate electrodes 5a, 5b can be formed.

Next, an $n^-$-type semiconductor region 6a with a low impurity concentration is formed by implanting ions of n-type impurities, such as phosphorus (P) etc., into the regions on both sides of the gate electrode 5a of the p-type well 3a and a $p^-$-type semiconductor region 6b with a low impurity concentration is formed by implanting ions of p-type impurities, such as boron (B) etc., into the regions on both sides of the gate electrode 5b of the n-type well 3b.

Next, a sidewall (sidewall spacer, sidewall insulating film) 7 including, for example, silicon oxide etc., is formed on the sidewall of the gate electrodes 5a, 5b. The sidewall 7 can be formed by, for example, depositing a silicon oxide film over the semiconductor substrate 1 and carrying out anisotropic etching (etch back) of the silicon oxide film.

Next, an $n^+$-type semiconductor region 8a (source, drain) is formed by implanting ions of n-type impurities, such as phosphorus (P) etc., into the regions on both sides of the gate electrode 5a and the sidewall 7 of the p-type well 3a. In addition, a $p^+$-type semiconductor region (source, drain) 8b is formed by implanting ions of p-type impurities, such as boron (P) etc., into the regions on both sides of the gate electrode 5b and the sidewall 7 of the n-type well 3b. The $n^+$-type semiconductor region 8a has a higher impurity concentration than that of the $n^-$-type semiconductor region 6a and the $p^+$-type semiconductor region 8b has a higher impurity concentration than that of the $p^-$-type semiconductor region 6b.

Figure 3:
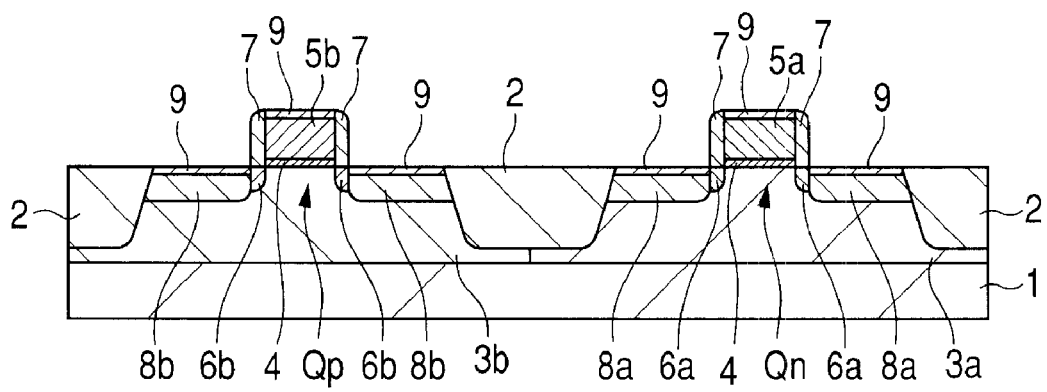
FIG. 3 is a cross-sectional view of essential parts in the manufacturing process of the semiconductor device, following FIG. 2.

Next, as shown in FIG. 3, a metal silicide layer 9 is formed respectively on the surfaces of the gate electrodes 5a, 5b, the $n^+$-type semiconductor region 8a, and the $p^+$-type semiconductor region 8b by exposing the surfaces of the gate electrodes 5a, 5b, the $n^+$-type semiconductor region 8a, and the $p^+$-type semiconductor region 8b, depositing a metal film, such as a nickel (Ni) film, and applying thermal treatment. Due to this, the diffusion resistance, the contact resistance, etc., of the $n^+$-type semiconductor region 8a and the $p^+$-type semiconductor region 8b can be reduced. After this, the metal film (nickel film) that has not reacted yet is removed.

In the present embodiment, it is preferable that the metal silicide layer 9 includes a nickel silicide rather than a cobalt silicide because of the requirement of reduction in resistance to cope with miniaturization. By forming the metal silicide layer 9 using a nickel silicide layer, it is possible to reduce the resistance of the metal silicide layer 9 and also to reduce the diffusion resistance, the contact resistance, etc., of the $n^+$-type semiconductor region 8a and the $p^+$-type semiconductor region 8b. However, the nickel silicide has a lower heat resistance compared to a cobalt silicide etc. and phase transition occurs at about 500° C. Because of this, after the metal silicide layer 9 is formed, only thermal treatment at about 500° C. or lower can be accepted.

In this manner, an n-channel type MISFET (Metal Insulator Semiconductor Field Effect Transistor) Qn is formed in the p-type well 3a of the semiconductor substrate 1 and a p-channel type MISFET (Metal Insulator Semiconductor Field Effect Transistor) Qp is formed in the n-type well 3b of the semiconductor substrate 1.

Figure 4:
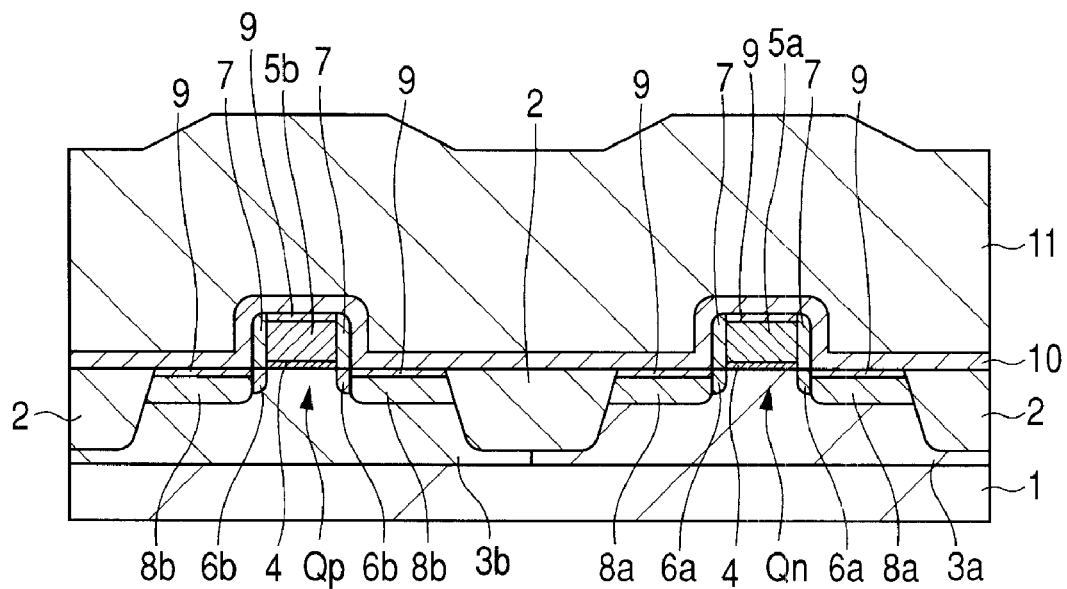
FIG. 4 is a cross-sectional view of essential parts in the manufacturing process of the semiconductor device, following FIG. 3.

Next, as shown in FIG. 4, an insulating film (etching stopper film, fifth insulating film) 10 including silicon nitride etc. and an insulating film (interlayer insulating film, first insulating film) 11 including silicon oxide etc. are formed (deposited) in order from the bottom over the semiconductor substrate 1 in such a manner as to cover the gate electrodes 5a, 5b and the sidewall 7. At this time, after the insulating film 10 is formed over the main surface of the semiconductor substrate 1 in which the MISFETs Qn, Qp are formed, the insulating film 11 is formed over the insulating film 10, and the insulating film 11 is formed so that the gap (space) between the gate electrodes 5a, 5b is embedded with the insulating film 11. The film thickness of the insulating film 10 (deposited film thickness, film thickness in the direction perpendicular to the main surface of the semiconductor substrate 1) is smaller than that of the insulating film 11 (deposited film thickness, film thickness in the direction perpendicular to the main surface of the semiconductor substrate 1). The insulating film 11 is an insulating film that functions as an interlayer insulating film and the insulating film 10 is an insulating film that functions as an etching stopper film when forming a contact hole in the insulating film 11. The insulating film 10 and the insulating film 11 are formed by materials capable of making the etching rates of both different from each other and the insulating film 10 is formed by an insulating film of material (preferably, silicon nitride film) different from that of the insulating film 11.

In the present embodiment, the insulating film 11 is an insulator film containing silicon (Si) and oxygen (O) (as constituent elements) and preferably, an insulating film containing silicon (Si) and oxygen (O) as main component, and most preferably, a silicon oxide ($SiO_x$) film. A silicon oxide film is typically a silicon dioxide ($SiO_2$) film, however, those of which the ratio between Si (silicon) atoms and O (oxygen)

atoms (the ratio of the numbers of atoms) deviates from the stoichiometric ratio ($SiO_2$) are assumed to be also included as a silicon oxide film.

It is preferable that the composition ratio between Si (silicon) and O (oxygen) in the insulating film 11, that is, the ratio of the number of O (oxygen) atoms to that of Si (silicon) atoms (number of O atoms/number of Si atoms), be not less than 1.5. In this case, in the insulating film 11, the oxygen (O) content is 1.5 times or more the silicon (Si) content in terms of the ratio of the numbers of atoms. If the composition of the insulating film 11 is represented by $SiO_x$, then, x in the $SiO_x$ is 1.5 or more ($x \geq 1.5$).

In addition, the insulating film 11 can further contain a trace of carbon (C) and in this case, it is preferable that the composition ratio between Si (silicon) and C (carbon) in the insulating film 11, that is, the ratio of the number of C (carbon) atoms to that of Si (silicon) atoms (number of C atoms/number of Si atoms) in the insulating film 11 be 0.05 or less. In this case, in the insulating film 11, the carbon (C) content is 5% or less of the silicon (Si) content in terms of the ratio of the numbers of atoms. If the composition of the insulating film 11 is represented by $SiO_xC_y$, then, x in the $SiO_xC_y$ is 1.5 or more ($x \geq 1.5$) and y is 0.05 or less ($y \leq 0.05$).

In addition, the insulating film 11 can further contain hydrogen (H).

Recently, as miniaturization advances, the distance between gate electrodes of a MISFET becomes narrower and therefore it is desired to use an insulating film with an excellent embeddability as the insulating film 11 to be formed so as to embed the space between gate electrodes. An insulating film formed by the plasma CVD (Chemical Vapor Deposition) method has an insufficient embeddability and there is the possibility that a void may occur because a narrow space between gate electrodes is not fully embedded, and therefore, in the present embodiment, an insulating film formed by the plasma CVD method is not used as the insulating film 11. In contrast to this, an insulating film formed by the thermal CVD method, such as an $O_3$-TEOS oxide film, or an insulating film formed by the coating method, such as an SOG film, is used in the present embodiment as the insulating film 11 because of its excellent embeddability into a space between gate electrodes. In other words, in the present embodiment, an insulating film capable of filling the narrow space between gate electrodes (an insulating film with an excellent embeddability, or an insulating film with a high reflowability) is used as the insulating film 11, and preferably, an insulating film is formed by the thermal CVD method or coating method rather than the plasma CVD method, and most preferably, the insulating film 11 is an $O_3$-TEOS oxide film or an SOG (Spin On Glass) film. As an SOG film used as the insulating film 11, for example, a polysilazane base SOG film may be used. AN SOG film is annealed (thermally treated) after coating, and the annealing temperature after coating is 400° C. to 500° C. Annealing of a polysilazane base SOG film is carried out in an oxidizing atmosphere in order to oxidize N (nitrogen) components.

The $O_3$-TEOS oxide film is a silicon oxide film formed by the thermal CVD method using $O_3$ (ozone) and TEOS (Tetraethoxysilane) as a raw material gas (source gas). The temperature of the substrate at the time of film formation is 400° C. to 500° C.

As described above, in the present embodiment, preferably, a nickel silicide layer is used as the metal silicide layer 9. Because of this, there are restrictions of the heat resistance (about 500° C.) of the nickel silicide constituting the metal silicide layer 9. Consequently, it is preferable to set the film-formation temperature (temperature of the substrate) to 500° C. (that is, the phase transition temperature of the nickel silicide constituting the metal silicide layer 9) or lower when forming the insulating film 11 by the thermal CVD method and set the annealing temperature (thermal treatment temperature to harden the applied film) after coating to 500° C. (that is, the phase transition temperature of the nickel silicide constituting the metal silicide layer 9) or lower when forming the insulating film 11 by the coating method.

Figure 12:
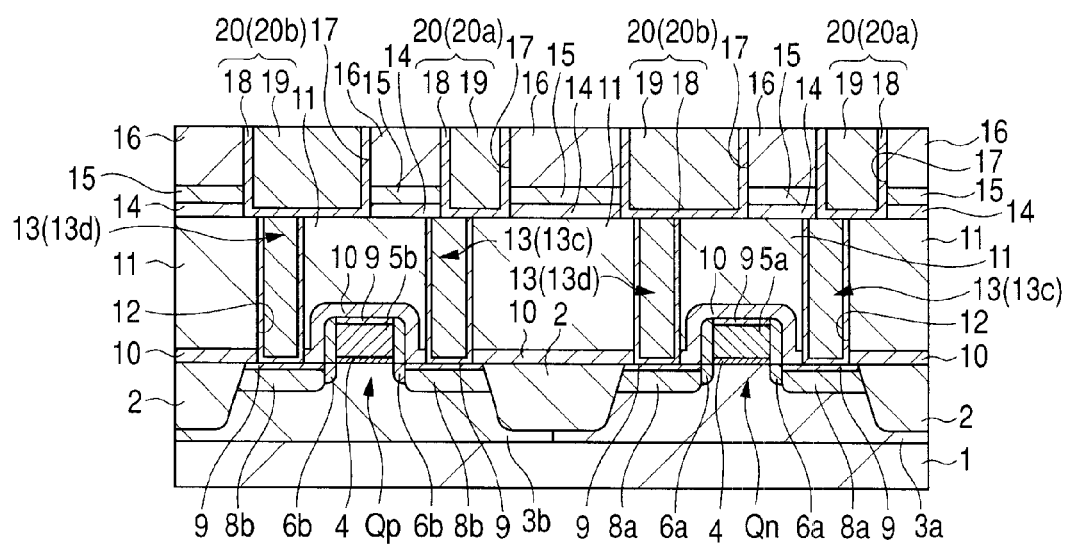
FIG. 12 is a cross-sectional view of essential parts in the manufacturing process of the semiconductor device, following FIG. 11.

Next, as shown in FIG. 12, the top surface of the insulating film 11 is flattened using the CMP (Chemical Mechanical Polishing) method etc. If the flatness of the insulating film 11 is excellent when the insulating film 11 is formed, the flattening processing of the insulating film 11 may be omitted.

Figure 6:
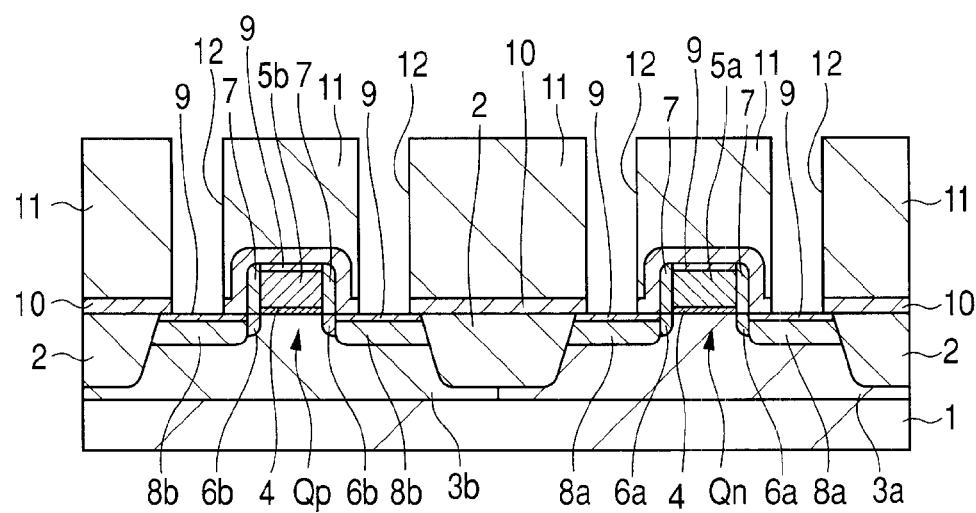
FIG. 6 is a cross-sectional view of essential parts in the manufacturing process of the semiconductor device, following FIG. 5.

Next, as shown in FIG. 6, a contact hole (first opening, opening, hole, through hole) 12 is formed in the insulating films 10, 11 by dry etching the insulating film 11 and insulating film 10 sequentially using the photoresist pattern (not shown) formed on the insulating film 11 as an etching mask. The contact hole 12 is formed in a laminated film including the insulating film 10 and the insulating film 11 and formed at the top etc. of the electrodes 5a, 5b, the $n^+$-type semiconductor region 8a, and the $p^+$-type semiconductor region 8b. At the bottom of the contact hole 12, part of the main surface of the semiconductor substrate 1, for example, part of the $n^+$-type semiconductor region 8a and the $p^+$-type semiconductor region 8b, part of the electrodes 5a, 5b, etc., is exposed.

In the dry etching process for forming the contact hole 12, first, the insulating film 11 is etched and the insulating film 10 is caused to function as an etching stopper under the etching condition that the insulating film 11 is more likely to be dry-etched than the insulating film 10, and then, the insulating film 10 is etched under the etching condition that the insulating film 10 is more likely to be dry-etched than the insulating film 11 and thus the contact hole 12 that penetrates through the insulating films 10, 11 is formed. By using the insulating film 10 as an etching stopper when etching the insulating film 11 in order to form the contact hole 12, it is possible to avoid damage to the substrate region due to too much digging and the machining dimension accuracy from decreasing. Because of this, although it is preferable to form the insulating film 10, the formation of the insulating film 10 may be omitted if unnecessary. When the insulating film 10 is formed, the contact hole 12 is formed in the laminated layer including the insulating film 10 and the insulating film 11, however, when the formation of the insulating film 10 is omitted, the contact hole 12 is formed in the insulating film 11.

Figure 7:
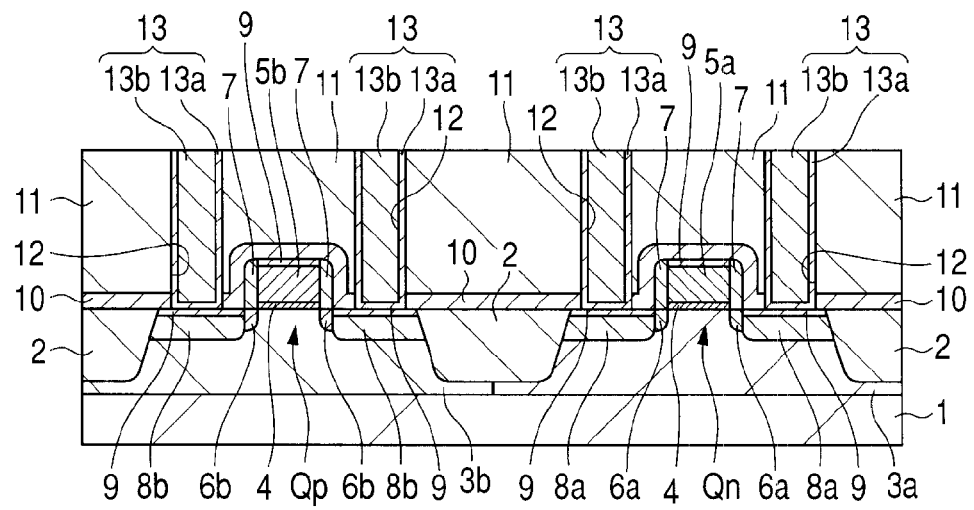
FIG. 7 is a cross-sectional view of essential parts in the manufacturing process of the semiconductor device, following FIG. 6.

Next, as shown in FIG. 7, a plug (conductor part, first conductor part) 13 including a conductor, such as a tungsten (W) film or a copper (Cu) film, is formed in the contact hole 12. The plug 13 is a conductor part (first conductor part) embedded in the contact hole 12 formed in the insulating films 10, 11. The plug 13 is formed, for example, as follows. After a conductive barrier film (barrier conductor film) 13a is formed over the insulating film 11 including the interior (sidewall and bottom) of the contact hole 12, a main conductor film 13b is formed over the conductive barrier film 13a so as to fill the inside of the contact hole 12, and the main conductor film 13b and the conductive barrier film 13a, which are no longer necessary, over the insulating film 11 are removed by the CMP method or the etch back method. When polishing the main conductor film 13b and the conductive barrier film 13a, the top of the insulating film 11 may be cut together due to the improper selectivity of polishing. The conductive barrier film 13a includes a titan film, a titan nitride film, or their laminated film and the main conductor film 13b includes a tungsten (W) film or a copper (Cu) film, for example. As described above, the plug 13 has the main conductor film 13b including copper (Cu) or tungsten (W) as a principal component and the conductive barrier film 13a that covers the sidewall 1 and the bottom of the main conductor film 13b.

Figure 8:
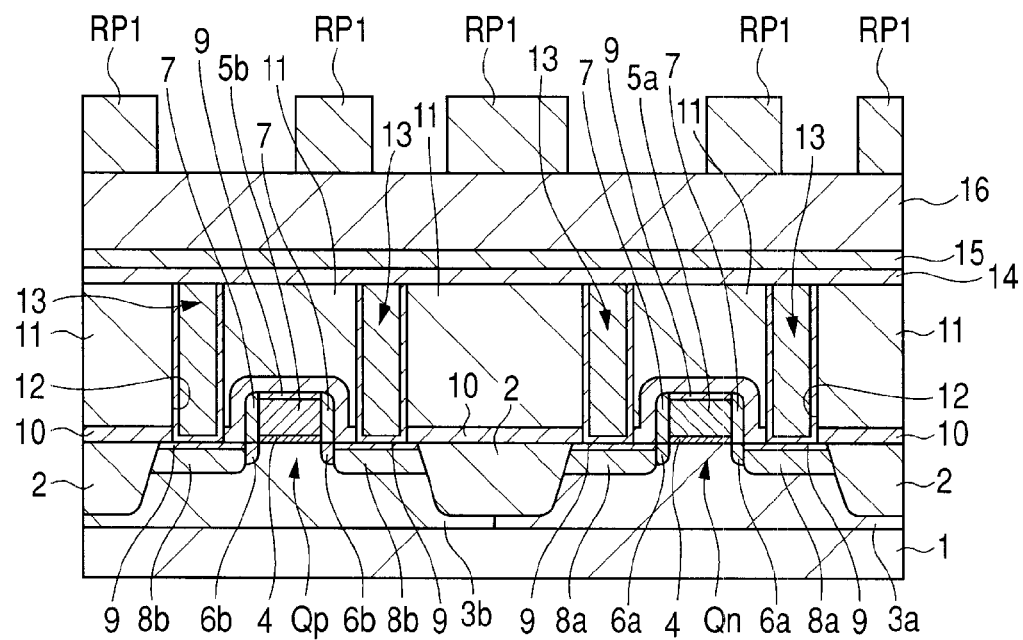
FIG. 8 is a cross-sectional view of essential parts in the manufacturing process of the semiconductor device, following FIG. 7.

Next, as shown in FIG. 8, an insulating film (second insulating film) 14 is formed over the insulating film 11 in which the plug 13 is embedded.

As described above, the insulating film 11 does not use an insulating film formed by the plasma CVD method but uses an insulating film with an excellent embeddability, such as an insulating film ($O_3$-TEOS oxide film) formed by the thermal CVD method or an insulating film (SOG film) formed by the coating method. However, such an insulating film with an excellent embeddability is less fine compared to an insulating film formed by the plasma CVD method and its density of the number of Si (silicon) atoms is small and its hygroscopicity is high, and therefore, its moisture content tends to be high because it absorbs moisture when formed. After the insulating film 11 is formed, if, unlike the present embodiment, annealing is carried out at, for example, 800° C. or higher, the insulating film 11 becomes finer, the density of the number of Si atoms increases, and becomes less hygroscopic, however, this cannot be done because of the restrictions of the heat resistance (about 500° C.) of the nickel silicide constituting the metal silicide layer 9. Because of this, if a film with a low moisture resistance is formed over the insulating film 11 so that it comes into contact with the insulating film 11, the interface between the film and the insulating film 11 becomes electrically weak, forming a dielectric breakdown path, and there is the possibility that the dielectric breakdown resistance may be lowered.

In the present embodiment, the insulating film 14 is formed over the insulating film 11 in which the plug 13 is embedded and it is preferable that the insulating film 14 be formed by the plasma CVD method in order to obtain a film excellent in electric characteristics and moisture resistance.

The insulating film 14 is an insulator film containing silicon (Si) and oxygen (O) (as constituent elements), however, preferably, the insulating film 14 contains silicon (Si) and oxygen (O) as principal components, and most preferably, the insulating film 14 is a silicon oxide ($SiO_x$) film or a silicon oxynitride (SiON) film. Here, a silicon oxynitride (SiON) film is an insulator film containing silicon (Si) and oxygen (O) as main components, into which nitrogen (N) has been introduced.

It is preferable that the composition ratio between Si (silicon) and O (oxygen) in the insulating film 14, that is, the ratio of the number of O (oxygen) atoms to that of Si (silicon) atoms (number of O atoms/number of Si atoms), be not less than 1.5. In this case, in the insulating film 14, the oxygen (O) content is 1.5 times or more the silicon (Si) content in terms of the ratio of the numbers of atoms. If the composition of the insulating film 14 is represented by $SiO_x$ (corresponding to the case where the insulating film 14 is a silicon oxide film) or $SiO_xN_y$ (corresponding to the case where the insulating film 14 is a silicon oxynitride film) then, x in the $SiO_x$ or $SiO_xN_y$ is 1.5 or more ($x \geq 1.5$).

When a silicon oxide ($SiO_x$) film not containing nitrogen (N) is used as the insulating film 14, it is possible to reduce the dielectric constant of the insulating film 14 and the parasitic capacitance between wires 20, to be described later. When a silicon oxynitride (SiON) film containing silicon (Si), oxygen (O), and nitrogen (N) is used as the insulating film 14, it is preferable that the composition ratio between Si (silicon) and N (nitrogen) in the insulating film 14, that is, the ratio of the number of N (nitrogen) atoms to that of Si (silicon) atoms (number of N atoms/number of Si atoms) in the insulating film 14 be not more than 0.2. In this case, in the insulating film 14, the nitrogen (N) content is 20% or less of the silicon (Si) content in terms of the ratio of the numbers of atoms. When the composition of the insulating film 14 is represented by $SiO_xN_y$, then x in the $SiO_xN_y$ is 1.5 or more ($x \geq 1.5$) and y is 0.2 or less ($y \leq 0.2$). By adjusting the ratio of the number of N (nitrogen) atoms to that of Si (silicon) atoms (number of N atoms/number of Si atoms) in the insulating film 14 to 0.2 or less it is possible to suppress an increase in the dielectric constant of the insulating film 14 due to the introduction of nitrogen (N) and reduce the parasitic capacitance between the wires 20, to be described later.

In addition, the insulating film 14 can further contain a trace of carbon (C) and in this case, it is preferable that the composition ratio between Si (silicon) and C (carbon) in the insulating film 14, that is, the ratio of the number of C (carbon) atoms to that of Si (silicon) atoms (number of C atoms/number of Si atoms) in the insulating film 14 be 0.05 or less. In this case, in the insulating film 14, the carbon (C) content is 5% or less of the silicon (Si) content in terms of the ratio of the numbers of atoms. If the composition of the insulating film 14 is represented by $SiO_xC_y$, then, x in the $SiO_xC_y$ is 1.5 or more ($x \geq 1.5$) and y is 0.05 or less ($y \leq 0.05$).

In addition, the insulating film 14 can further contain hydrogen (H).

As described above, the insulating film (here, the insulating film 14) formed by the plasma CVD method is less excellent in the embeddability into a narrow space compared with the insulating film (here, the insulating film 11) formed by the thermal CVD method or coating method, however, it is a fine film with a high density of the number of Si (silicon) atoms in the film, and therefore, it becomes less hygroscopic and more moisture resistant. Since the insulating film 14 is formed over the flat top surface of the insulating film 11, there arises no problem of the embeddability and it is possible to cover the insulating film 11 that tends to have a high moisture content with the insulating film 14 having a higher density of the number of Si (silicon) atoms and a more excellent moisture resistance than the insulating film 11. Because of this, it is unlikely that the interface between the insulating film 11 and the insulating film 14 becomes electrically weak and the dielectric breakdown path can be prevented from being formed and the dielectric breakdown resistance can be improved.

If the film thickness of the insulating film 14 is too small, the effect to improve the dielectric breakdown resistance by providing the insulating film 14 is reduced. Because of this, it is preferable that the film thickness of the insulating film 14 (deposited film thickness, film thickness in the direction perpendicular to the main surface of the semiconductor substrate 1) be 10 nm or more and thereby it is possible to accurately obtain the effect to improve the dielectric breakdown resistance by providing the insulating film 14. In addition, if the film thickness of the insulating film 14 is too large, the thickness of the wire 20, to be described later, tends to vary. Because of this, it is preferable that the film thickness of the insulating film 14 (deposited film thickness, film thickness in the direction perpendicular to the main surface of the semiconductor substrate 1) be one-third or less the thickness of the wire 20, to be described later, (the film thickness in the direction perpendicular to the main surface of the semiconductor substrate 1) and thereby it is possible to accurately prevent the thickness of the wire 20, to be described later, from varying. In addition, although depending on the thickness of the wire (the wire 20, to be described later) to be formed, the film thickness of the insulating film 14 (deposited film thickness) may be, for example, about 10 to 50 nm.

As described above, in the present embodiment, the insulating film 14 (second insulating film) has a higher density of the number of Si (silicon) atoms than that of the insulating film 11 (first insulating film). Here, the density of the number of Si (silicon) atoms corresponds to the number of Si (silicon) atoms per unit volume. It is therefore possible to describe that the insulating film 14 has a larger number of Si (silicon) atoms per unit volume than that of the insulating film 11.

In the case of an insulating film containing silicon (Si) and oxygen (O) as main components, such as the insulating films 11, 14, the lower the density of the number of Si (silicon) atoms, the less fine and the more hygroscopic (more likely to absorb moisture) the film becomes. The relationship, in which the lower the density of the number of Si (silicon) atoms, the more hygroscopic (more likely to absorb moisture) the film becomes, also holds not only in the case of the silicon oxide ($SiO_x$) film including silicon (Si) and oxygen (O) but also in the case of the silicon oxynitride (SiON) film including silicon (Si), oxygen (O), and nitrogen (N) provided the ratio of the number of N (nitrogen) atoms to that of Si (silicon) atoms (number of N atoms/number of Si atoms) in the film is 0.2 or less. Further, in either case of comparisons between silicon oxide films, between silicon oxynitride films, and between a silicon oxide film and a silicon oxynitride film, the relationship, in which the lower the density of the number of Si (silicon) atoms, the more hygroscopic (more likely to absorb moisture) the film becomes, holds if the ratio of the number of N (nitrogen) atoms to that of Si (silicon) atoms (number of N atoms/number of Si atoms) in the silicon oxynitride film is 0.2 or less. Furthermore, the above-mentioned relationship, in which the lower the density of the number of Si (silicon) atoms, the more hygroscopic (more likely to absorb moisture) the film becomes, holds even in the case where one of or both the insulating films 11, 14 further contain a trace of carbon (C) (the ratio of the number of C (carbon) atoms to that of Si (silicon) atoms (number of C atoms/number of Si atoms) in the film is about 0.05 or less). As a result, in the present embodiment, the insulating film 14 is a film with a higher density of the number of Si (silicon) atoms than that of the insulating film and the insulating film 14 is a film with a lower hygroscopicity than that of the insulating film 11.

An insulating film containing silicon (Si) and oxygen (O) as principal components, such as the insulating films 11, 14, can be etched by a hydrofluoric acid (HF) and the lower the density of the number of Si (silicon) atoms (as a result, the more hygroscopic), the greater the etching rate by a hydrofluoric acid becomes (more likely to be wet-etched). Because of this, in the case of an insulating film containing silicon (Si) and oxygen (O) as principal components, such as the insulating films 11, 14, it is possible to determine that the greater the etching rate by a hydrofluoric acid (HF), the lower the density of the number of Si (silicon) atoms and the more hygroscopic the film is. As a result, it is possible to determine which of the insulating film 11 and the insulating film 14 has a higher density of the number of Si (silicon) atoms and therefore which is less hygroscopic by comparing the etching rates by a hydrofluoric acid. In the present embodiment, the insulating film 14 (second insulating film) is a film with a higher density of the number of Si (silicon) atoms than that of the insulating film 11 (first insulating film) and is less hygroscopic than the insulating film 11, and therefore, when etching by a hydrofluoric acid is carried out, the etching rate by a hydrofluoric acid is smaller in the insulating film 14 (second insulating film) than in the insulating film 11 (first insulating film). In other words, a silicon oxide film or a silicon oxynitride film (the insulating film 14) formed by the plasma CVD method has a higher density of the number of Si (silicon) atoms and a lower etching rate by a hydrofluoric acid and less hygroscopic than an $O_3$-TEOS oxide film or an SOG film (the insulating film 11).

Next, an insulating film (third insulating film, etching stopper film) 15 is formed over the insulating film 14. Then, an insulating film 16 (fourth insulating film, interlayer insulating film) is formed over the insulating film 15.

The insulating film 15 is formed in order to avoid damages to the lower layer due to too much digging and the machining dimension accuracy from deteriorating when forming a groove or hole (opening 17, to be described later) for forming a wire in the insulating film 16 of the upper layer by etching. In other words, it is possible for the insulating film 15 to function as an etching stopper (etching stopper film) when etching the insulating film 16 of the upper layer. To this end, the insulating film 15 and the insulating film 16 include material films different from each other and material films the etching rates of which are different.

In order to cause the insulating film 15 to function as an etching stopper when etching the insulating film 16, it is preferable to use an insulating film with a high etching selection ratio with respect to the insulating film 16 (for example, with an etching selection ratio of three or more) as the insulating film 15. Such materials with a high etching selection ratio may include silicon nitride (SiN) and silicon carbide (SiC) base materials, however, the silicon nitride has a high dielectric constant (for example, the relative dielectric constant $k=7$ to 8) and increases the parasitic capacitance between wires, and therefore, it is preferable to use a silicon carbide (SiC) base material with a lower dielectric constant than a silicon nitride (SiN) base material (for example, the relative dielectric constant $k=3.5$ to 5 approximately) as the insulating film 15 because a high etching selection ratio and a low dielectric constant can be realized.

However, the silicon carbide base material film has the properties that the leak current is larger, the dielectric withstand voltage is lower, moisture resistance is lower, and the electric characteristics are more likely to deteriorate due to moisture absorption compared with those of a silicon oxide film. Because of this, if a silicon carbide base material film is in direct contact with the insulating film 11 that tends to have a high moisture content, its interface becomes electrically weak and a dielectric breakdown path may be formed.

In the present embodiment, therefore, over the insulating film 11 that tends to have a high moisture content, the insulating film 14 with a higher density of the number of Si (silicon) atoms, less hygroscopic, and more excellent in moisture resistance than the insulating film 11 is formed, and by forming the insulating film 15 over the insulating film 14, the insulating film 15 is prevented from coming into direct contact with the insulating film 11 that tends to have a high moisture content even if a silicon carbide base material with a low moisture resistance is used as the insulating film 15. Because of this, it is possible to prevent a problem resulting from the low moisture resistance from arising even if a silicon carbide base material film is used as the insulating film 15.

In the present embodiment, therefore, the insulating film 15 is a silicon carbide (SiC) base material film, that is, an insulator film containing silicon (Si) and carbon (C) (as constituent elements). It is preferable that the silicon carbide (SiC) base material constituting the insulating film 15 contains silicon (Si) and carbon (C) as principal components, however, hydrogen (H), nitrogen (N), and oxygen (O) may be contained in addition to silicon (Si) and carbon (C). As a result, it is possible to use as the insulating film 15, a SiC film (silicon carbide film) including Si (silicon) and carbon (C), a SiCN film (silicon carbonitride film) including Si (silicon), carbon (C), and nitrogen (N), or a SiCO film including Si (silicon), carbon (C), and oxygen (O). Here, the SiCN film is an insulator film containing silicon (Si) and carbon (C) as principal components and into which nitrogen (N) has been introduced, and the SiCO film is an insulator film containing silicon (Si) and carbon (C) as principal components and into which oxygen (O) has been introduced. As described above, it is possible to make the dielectric constant (relative dielectric constant) of the insulating film 15 lower than that (relative dielectric constant) of silicon nitride by using the silicon carbide (SiC) base material.

The insulating film 16 is an insulator film that functions as an interlayer insulating film and contains silicon (Si) and oxygen (O) (as constituent elements). It is preferable that the insulating film 16 be a low dielectric constant insulating film including a low dielectric constant material (so-called Low-K insulating film, Low-K material) because the parasitic capacitance between neighboring wires can be reduced. The low dielectric constant insulating film (Low-K insulating film) includes, for example, an insulating film with a lower dielectric constant than that of a silicon oxide film (for example, a TEOS (Tetraethoxysilane) oxide film) included in a passivation film. In general, an insulating film (insulating material) with a lower relative dielectric constant than that ($\in$=4.1 to 4.2, approximately) of a TEOS oxide film is referred to as a low dielectric constant insulating film (low dielectric constant material).

The above-mentioned low dielectric constant material includes an organic polymer base material and a silica base material. Of these, the organic polymer not containing Si as a principal component is more likely to deform and has a weak point in that stress is concentrated to the wire part that is unlikely to deform, resulting in breakage. Because of this, the silica base material containing Si (silicon) and O (oxygen) as its principal components is used mainly. In the present embodiment, when a low dielectric constant material is used as the insulating film 16, the silica base material (silica base low dielectric constant material) is used.

The above-mentioned silica base low dielectric constant material includes, for example, those containing Si—F, Si—CH$_3$. The Si—F base material is generally called FSG (Fluorinated Silica Glass) and the Si—CH$_3$ base material, SiOC or OSG (Organo Silica Glass), and the relative dielectric constants are about 3.5 to 3.8 and 2.1 to 3.3, respectively. A general method of forming a film is described below. The Si—F base material is formed by the plasma CVD method. The principal components of the raw material gas include a component containing Si (SiH$_4$, TEOS (Tetraethoxysilane), etc.), an oxidant (O$_2$, N$_2$O, etc.), and a component containing F (SiF$_4$, CF$_4$, etc.) and the substrate temperature is 350 to 400° C. The Si—CH$_3$ base material can be formed not only by the spin coating method but also by the CVD method. The spin coating method uses an oligomer solution synthesized from an alcohol solution etc. of a component containing Si—O (TEOS etc.) and a component containing Si—CH$_3$ (MTES (Monomethyltriethoxysilane), or DMDES (Dimethyldiethoxysilane), etc.). This solution is applied to a substrate while spinning, and heated and hardened at 400 to 450° C. When a film is formed by the CVD method, the main components of a raw material gas are a component containing Si—CH$_3$ (3MS (Trimethylsilane), TMCTS (Tetramethylcyclo-tetrasiloxanes), etc.), an oxidant (O$_2$, CO$_2$, etc.) and the substrate temperature is 350 to 400° C.

If such a low dielectric constant material as described above is used as the insulating film 16 (that is, if an insulating film with a lower dielectric constant than that of a silicon oxide film is used as the insulating film 16), it is possible to reduce the parasitic capacitance between neighboring wires and it is also possible to use a silicon oxide (SiO$_x$) film including Si (silicon) and O (oxygen) or a silicon oxynitride (SiON) film including Si (silicon), 0 (oxygen), and N (nitrogen) as the insulating film 16. Here, the silicon oxynitride (SiON) film is an insulator film containing silicon (Si) and oxygen (O) as its principal components and into which nitrogen (N) has been introduced. As a result, although the insulating film 16 is an insulating film containing silicon (Si) and oxygen (O), it may contain nitrogen (N), carbon (C), fluorine (F), and hydrogen (H), in addition to silicon (Si) and oxygen (O).

As described above, the insulating film 16 contains silicon (Si) and oxygen (O), preferably, the insulating film 16 contains silicon (Si) and oxygen (O) as its principal components, and most preferably, the insulating film 16 is a silicon oxide film, a silicon oxynitride film, or an insulating film with a lower dielectric constant than that of a silicon oxide film (low dielectric constant insulating film). When a low dielectric constant insulating film is used as the insulating film 16, a silica base low dielectric constant material containing Si (silicon) and O (oxygen) as its principal components is used as described above.

It is preferable that the composition ratio between Si (silicon) and O (oxygen) in the insulating film 16, that is, the ratio of the number of O (oxygen) atoms to that of Si (silicon) atoms (number of O atoms/number of Si atoms) in the insulating film 16 be 1.0 or more. In this case, in the insulating film 16, the oxygen (O) content is 1.0 time or more the silicon (Si) content in terms of the ratio of the numbers of atoms, in other words, in the insulating film 16, the oxygen (O) content is not less than the silicon (Si) content. When the composition of the insulating film 16 is represented by SiO$_x$ (corresponding to the case where the insulating film 16 is a silicon oxide film), SiO$_x$F$_y$ (corresponding to the case where the insulating film 16 is a silica base low dielectric constant material film containing fluorine), or SiO$_x$C$_y$ (corresponding to the case where the insulating film 16 is a silica base low dielectric constant material film containing carbon), then, x in the SiO$_x$, SiO$_x$F$_y$, or SiO$_x$C$_y$ is 1.0 or more (x≧1.0). In addition, in order to reduce the relative dielectric constant (for example, 3.3 or less), it is preferable to set y in the above SiO$_x$C$_y$ to 0.5 or more (y≦0.5).

In the present embodiment, as described above, when etching the insulating film 16, the insulating film 15 including the silicon carbide (SiC) base material is used as an etching stopper. Because of this, it is necessary to increase the etching selection ratio of the insulating film 15 (etching rate of the insulating film 16 divided by etching rate of the insulating film 15 under the etching condition when the insulating film 16 is etched using the insulating film 15 as an etching stopper). Since the insulating film 16 contains silicon (Si) and oxygen (O) as its principal components, when the insulating film 15 does not contain oxygen (O), that is, when a SiC film (silicon carbide film) or a SiCN film (silicon carbonitride film) is used as the insulating film 15, it is possible to ensure a sufficient etching selection ratio as an etching stopper by increasing the etching selection ratio of the insulating film 15. As a result, it is possible to cause the insulating film 15 to sufficiently function as an etching stopper when etching the insulating film 16.

On the other hand, when the insulating film 15 contains oxygen (O), that is, when a SiCO film is used as the insulating film 15, if its oxygen (O) content is too high, there is the possibility that a sufficient etching selection ratio as an etching stopper cannot be obtained, and therefore, it is preferable to adjust the composition ratio between Si (silicon) and O (oxygen) in the insulating film 15, that is, the ratio of the number of O (oxygen) atoms to that of Si (silicon) atoms (number of O atoms/number of Si atoms) in the insulating film 15 to less than 1.0. In this case, in the insulating film 15, the oxygen (O) content is less than 1.0 time the silicon (Si) content in terms of the ratio of the numbers of atoms, that is, in the insulating film 15, the oxygen (O) content is less than the silicon (Si) content. If the composition of the insulating film 15 when containing oxygen is represented by $SiC_xO_y$, then, y in the $SiC_xO_y$ is less than 1.0 (y<1.0). Because of this, even when the insulating film 15 contains oxygen (O), the ratio of the number of O (oxygen) atoms to that of Si (silicon) atoms (number of O atoms/number of Si atoms) in the insulating film 15 is smaller than the ratio of the number of O (oxygen) atoms to that of Si (silicon) atoms (number of O atoms/number of Si atoms) in the insulating film 16. In this manner, it is possible to ensure an etching selection ratio necessary as an etching stopper by increasing the etching selection ratio of the insulating film 15 and cause the insulating film 15 to function as an etching stopper when etching the insulating film 16.

Although containing silicon (Si) and carbon (C) as its principal components without exception, the insulating film 15 may not contain nitrogen (N) or oxygen (O), and therefore the composition ratio between Si (silicon) and O (oxygen) in the insulating film 15, that is, the ratio of the number of O (oxygen) atoms to that of Si (silicon) atoms (number of O atoms/number of Si atoms) in the insulating film 15 is not less than zero and less than 1.0. In other words, in the insulating film 15, the oxygen (O) content is not less than zero and less than 1.0 times the silicon (Si) content in terms of the ratio of the numbers of atoms, that is, in the insulating film 15, the oxygen (O) content is less than the silicon (Si) content. If the composition of the insulating film 15 is represented by $SiC_xN_yO_z$, then, z in the $SiC_xN_yO_z$ is not less than zero and less than 1.0 ($0 \leq z < 1.0$).

In addition, as described above, while the insulating films 11, 14 do not contain carbon (C) or contain a trace thereof (the ratio of the number of C (carbon) atoms to that of Si (silicon) atoms (number of C atoms/number of Si atoms) in the insulating films 11, 14 is 0.05 or less), the insulating film 15 contains carbon (C) as a principal component. Due to this, the carbon (C) content in the insulating films 11, 14 is compared with that in the insulating film 15, even if the insulating films 11, 14 contain carbon (C), the ratio of the number of C (carbon) atoms to that of Si (silicon) atoms (number of C atoms/number of Si atoms) in the insulating films 11, 14 is smaller than the ratio of the number of C (carbon) atoms to that of Si (silicon) atoms (number of C atoms/number of Si atoms) in the insulating film 15. In addition, when the oxygen (O) content in the insulating films 11, 14 is compared with that in the insulating film 15, even if the insulating film 15 contains oxygen (O) (in the case where the insulating film 15 is a SiCO film), the ratio of the number of O (oxygen) atoms to that of Si (silicon) atoms (number of O atoms/number of Si atoms) in the insulating film 15 is smaller than the ratio of the number of O (oxygen) atoms to that of Si (silicon) atoms (number of O atoms/number of Si atoms) in the insulating films 11, 14.

If the function of the insulating film 15 as an etching stopper and the advantage of the silicon carbide (SiC) base material that its dielectric constant (relative dielectric constant) is lower than that of the silicon nitride are taken into consideration, it is preferable to adjust the composition ratio between Si (silicon) and C (carbon) in the insulating film 15, that is, the ratio of the number of C (carbon) atoms to that of Si (silicon) atoms (number of C atoms/number of Si atoms) to 0.5 or more. In this case, in the insulating film 15, the carbon (C) content is 0.5 times or more the silicon (Si) content in terms of the ratio of the numbers of atoms. If the composition of the insulating film 15 is represented by $SiC_x$ (corresponding to the case where the insulating film 15 is a SiC film), $SiC_xN_y$ (corresponding to the case where the insulating film 15 is a SiCN film), or $SiC_xO_y$ (corresponding to the case where the insulating film 15 is a SiCO film), then, x in the $SiC_x$, $SiC_xN_y$, or $SiC_xO_y$ is 0.5 or more ($x \geq 0.5$).

In addition, the insulating film 16 does not contain carbon (C) or contains a trace thereof (for example, the ratio of the number of C (carbon) atoms to that of Si (silicon) atoms (number of C atoms/number of Si atoms) is about 0.05 or less) when it is a silicon oxide film or a silicon oxynitride film, however, when it is a silica base low dielectric constant material film containing carbon (C) (when the insulating film 16 is a SiOC film), it is possible to contain carbon (C) to some extent (for example, about the same amount of silicon atoms). However, when the oxygen (O) content in the insulating film 15 is compared with that in the insulating film 16, even if the insulating film 15 contains oxygen (O) (when the insulating film 15 is a SiCO film), the ratio of the number of O (oxygen) atoms to that of Si (silicon) atoms (number of O atoms/number of Si atoms) in the insulating film 15 is smaller than the ratio of the number of O (oxygen) atoms to that of Si (silicon) atoms (number of O atoms/number of Si atoms) in the insulating film 16. Due to this, it is possible to cause the insulating film 15 to function as an etching stopper when etching the insulating film 16.

It is possible to adjust the film thickness (deposited film thickness) of the insulating film 15 to, for example, about 10 to 60 nm and the film thickness (deposited film thickness) of the insulating film 16 to, for example, about 50 to 150 nm, although they depend on the thickness of the wire (the wire 20, to be described late) to be formed.

Next, on the insulating film 16, a resist pattern (photoresist pattern) RP1 is formed using the photolithography method.

Figure 9:
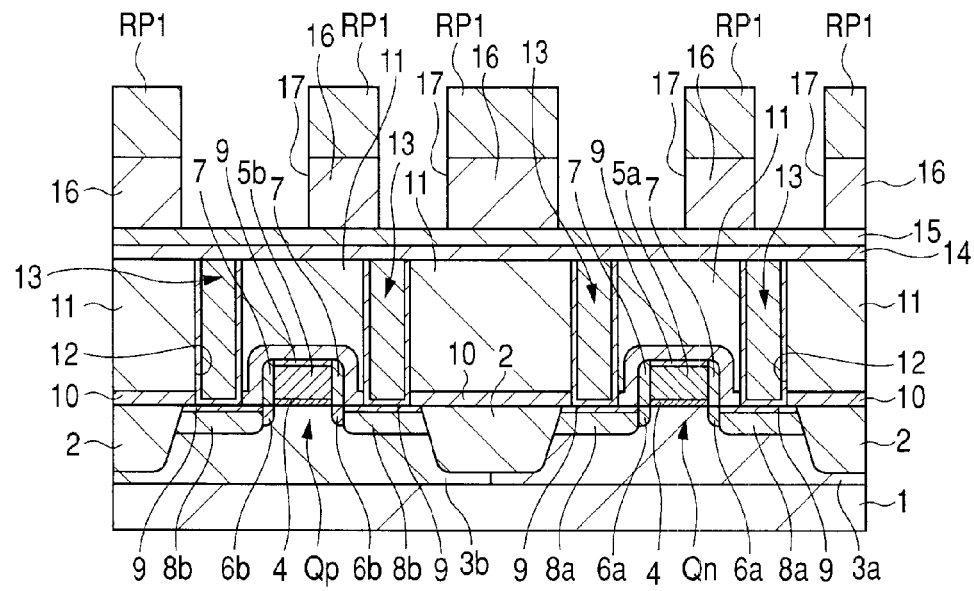
FIG. 9 is a cross-sectional view of essential parts in the manufacturing process of the semiconductor device, following FIG. 8.

Next, as shown in FIG. 9, an opening (wire opening) 17 is formed in the insulating film 16 by etching (dry etching) the insulating film 16 using the resist pattern RP1 as an etching mask to selectively remove the insulating film 16. At this time, the insulating film 15 of the lower layer is caused to function as an etching stopper (etching stopper film) by etching the insulating film 16 under the condition that the insulating film 16 is more likely to be dry etched than the insulating film 15. At the bottom of the opening 17, the insulating film 15 is exposed.

Figure 10:
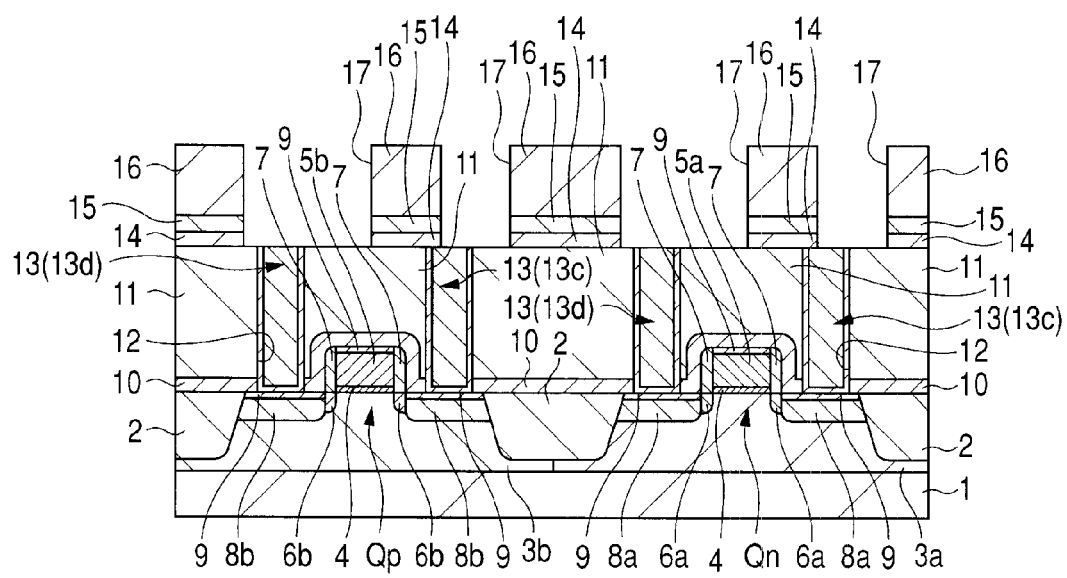
FIG. 10 is a cross-sectional view of essential parts in the manufacturing process of the semiconductor device, following FIG. 9.

Next, the insulating films 15, 14 at the bottom of the opening 17 of the insulating film 16 are etched (dry etched) and removed selectively using the resist pattern RP1 as an etching mask. At this time, the insulating film 15 and insulating film 14 are etched under the condition that the insulating films 14, 15 are more likely to be dry etched than insulating film 16. In this manner, the opening (wire opening) 17 is formed in the insulating films 14, 15, 16. At the bottom of the opening 17, (at least part of) the top surface of the plug 13 is exposed. After this, the resist pattern RP1 is removed. Due to this, the structure in FIG. 10 is obtained.

According to the design, the opening 17 is formed in the insulating films 14, 15, 16 so that the entire top surface of the plug 13 is included in the plane of the opening 17. Actually, however, resulting from an alignment error of the photolithography etc., there is the possibility that a misalignment between the opening 17 and the plug 13 may occur. In order to expose the entire top surface of the plug 13 at the bottom of the opening 17 despite the misalignment, one of measures is to design in advance the dimension of the opening 17 larger, taking the amount of misalignment into account, however, this may bring about a problem of an increase in the chip size of the semiconductor device accordingly. Generally, it is accepted that part of the top surface of the plug 13 is not exposed but bulges out in a planar perspective, provided a sufficient contact area can be obtained for an electric coupling. In FIG. 10, the entire top surface of a plug 13d among the plugs 13 is exposed at the bottom of the opening 17 but only part of the top surface of a plug 13c is exposed at the bottom of the opening 17.

Figure 11:
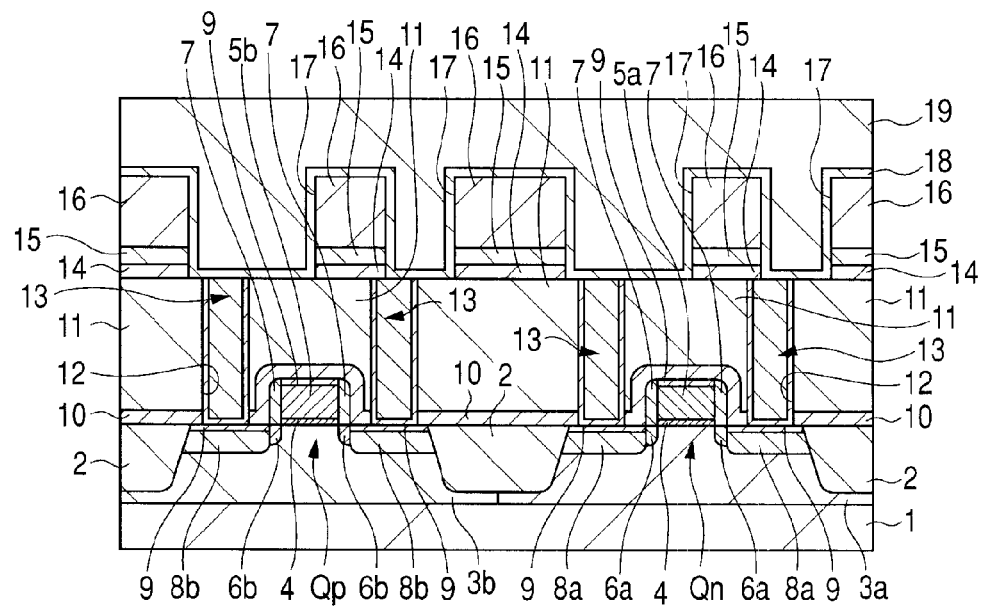
FIG. 11 is a cross-sectional view of essential parts in the manufacturing process of the semiconductor device, following FIG. 10.

Next, as shown in FIG. 11, a comparatively thin conductive barrier film (barrier conductor film) 18 with a thickness of about 50 nm, including, for example, a tantalum (Ta) film, a tantalum nitride (TaN) film, or a laminated film thereof, is formed on the entire surface over the main surface of the semiconductor substrate 1 (that is, over the insulating film 16 including the bottom and the sidewall of the opening 17). The sputtering method, the CVD method, etc., can be used to form the conductive barrier film 18. The conductive barrier film 18 has, for example, a function of inhibiting or preventing the diffusion of copper of a main conductor film 19, to be described later, a function of improving the close adhesion between the main conductor film 19 and the insulating film (the insulating films 14 to 16), etc. As a material of such a conductive barrier film 18, a high melting-point metal nitride, such as tungsten nitride (WN) or titan nitride (TiN) that hardly reacts with copper, can be used instead of the above-mentioned tantalum base material. As a material of the conductive barrier film 18, a material of a high melting-point metal nitride to which silicon (Si) has been added, or a high melting-point metal, such as titan (Ti), tungsten (W), an alloy of titan and tungsten (TiW), etc., which hardly react with copper can be used. In addition, as the conductive barrier film 18, not only a single film but also a laminated film of the above-mentioned material films can be used.

Next, the relatively thick main conductor film 19 with a thickness of, for example, about 800 to 1,600 nm including copper is formed on the conductive barrier film 18 so that it fills the opening 17. The main conductor film 19 can be formed by, for example, the sputtering method, the plating method, etc. In addition, the main conductor film 19 can be formed from a conductor film containing copper as a main component, such as, for example, copper or an alloy of copper (containing Cu as a main component, and for example, Mg, Ag, Pd, Ti, Ta, Al, Nb, Zr, or Zn, etc., is included). It may also be possible to form the main conductor film 19 including a relatively thick copper (or an alloy of copper) etc. over a seed film by the plating method etc. after forming the seed film including a relatively thin copper (or an alloy of copper) over the conductive barrier film 18 by the sputtering method etc. Then, by subjecting the semiconductor substrate 1 to thermal treatment in, for example, a non-oxidizing atmosphere (for example, a hydrogen atmosphere), the crystal grains of the main conductor film 19 are caused to grow.

Figure 5:
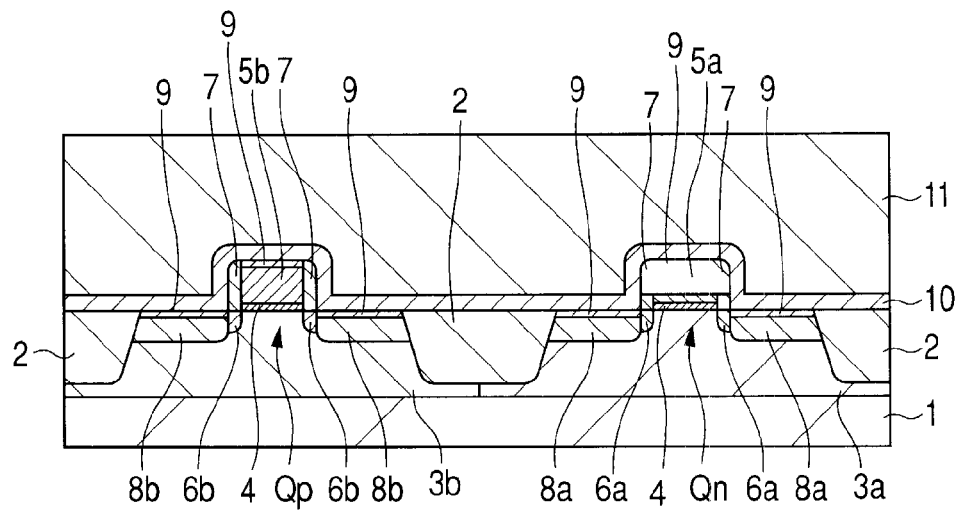
FIG. 5 is a cross-sectional view of essential parts in the manufacturing process of the semiconductor device, following FIG. 4.

Next, as shown in FIG. 12, the main conductor film 19 and the conductive barrier film 18 are polished by, for example, the CMP method until the top surface of the insulating film 16 is exposed. By removing the unnecessary conductive barrier film 18 and main conductor film 19 over the insulating film 16 and leaving the conductive barrier film 18 and the main conductor film 19 in the opening 17 as a wire opening, the wire (first layer wire, lowermost layer wire, first wire) 20 including the relatively thin conductive barrier film 18 and the relatively thick main conductor film 19 is formed in the openings 17, as shown in FIG. 5. The wire 20 is a wire (embedded wire) embedded in the opening 17 of the insulating films 14, 15, 16 and electrically coupled with the plug 13 by part of its bottom that comes into contact with the (top surface of) the plug 13. The wire 20 is electrically coupled with an n$^+$-type semiconductor region (source, drain) 8a, a p$^+$-type semiconductor region (source, drain) 8b, or the gate electrodes 5a, 5b, etc., via the plug 13. It is also possible to remove the unnecessary conductive barrier film 18 and main conductor film 19 by etching (electrolytic etching etc.) instead of the CMP method.

In the present embodiment, as described with reference to FIG. 10, a misalignment between the opening 17 and the plug 13 is accepted and it is only required that at least part of the top surface of the plug 13 be exposed from the opening 17 and in contact with the wire 20. Because of this, the entire top surface of the plug 13d, among the plugs 13, is exposed from the opening 17 and in contact with the wire 20, however, only part of the top surface of the plug 13c, among the plugs 13, is exposed at the bottom of the opening 17 and in contact with the wire 20 and the rest of the top surface is covered with the insulating film 14 (laminated film of the insulating films 14, 15, 16). In other words, part of the top surface of the plug 13c overlaps with the wire 20 in a plane and comes into contact with the wire 20 and the other part of the top surface is covered with the insulating film 14 (laminated film of the insulating films 14, 15, 16). In such a case, the distance between the plug 13c and a wire 20b neighboring a wire 20a coupled with the plug 13c is shorter than the distance between the wire 20a and the wire 20b (the closest distance between the wires 20) and the dielectric breakdown is more likely to occur between the plug 13c and the wire 20b close to each other. However, in the present embodiment, by interposing the insulating film 14 between the insulating film 11 that tends to have a high moisture content and the insulating film 15 with a low moisture resistance, an electrically weak dielectric breakdown path can be prevented from being formed between the plug 13c and the wire 20b, and therefore, it is possible to prevent dielectric breakdown from occurring between the plug 13c and the wire 20b even if the plug 13c and the wire 20b come closer to each other.

The plug 13 has the semiconductor film 13b containing copper (Cu) or tungsten (W) as a principal component and the insulating film 14 includes an insulating film (preferably, a silicon oxide film or silicon oxynitride (SiON) film) containing silicon (Si) and oxygen (O), and when the plug 13 contains copper (Cu) (when the main conductor film 13b contains copper (Cu) as a principal component), preferably, the insulating film 14 is a silicon oxynitride (SiON) film. This is that when part of the top surface of the plug 13c is covered with the insulating film 14 (the insulating films 14, 15, 16) due to the misalignment between the opening 17 and the plug 13 and if the plug 13 contains copper (Cu) (if the main conductor film 13b contains copper (Cu) as a principal component), there is the possibility that the copper (Cu) in (the main conductor film 13b of) the plug 13 may diffuse into the insulating film 14. A silicon oxynitride (SiON) film containing silicon (Si), oxygen (O), and nitrogen (N) has the property of barrier against copper (function of inhibiting or preventing diffusion of copper). Because of this, when the plug 13 contains copper (Cu), even if part of the top surface of the plug 13c is covered with the insulating film 14 (laminated film of the insulating films 14, 15, 16) due to the misalignment between the opening 17 and the plug 13, it is possible to inhibit or prevent the copper (Cu) in the plug 13 from diffusing into the insulating film 14 by using a silicon oxynitride (SiON) film as the insulating film 14. Due to this, it is possible to accurately prevent dielectric breakdown from occurring between the plug 13c and the wire 20b.

When the plug 13 contains copper (Cu) and a silicon oxynitride (SiON) film is used as the insulating film 14, it is preferable that the composition ratio between Si (silicon) and N (nitrogen) in the insulating film 14, that is, the ratio of the number of N (nitrogen) atoms to that of Si (silicon) atoms (number of N atoms/number of Si atoms) be 0.01 or more. In this case, in the insulating film 14, the nitrogen (N) content is 1% or more of the silicon (Si) content in terms of the ratio of numbers of atoms. If the composition of the insulating film 14 is represented by $SiO_xN_y$, then, y in the $SiO_xN_y$ is 0.01 or more ($y \geqq 0.01$). Due to this, it is possible to accurately prevent dielectric breakdown from occurring between the plug 13c and the wire 20b by strengthening the property of barrier against copper of the insulating film 14.

If the nitrogen (N) content in the insulating film 14 is too high, the dielectric constant of the insulating film 14 increases and the parasitic capacitance between the wires 20 increases. Due to this, when the plug 13 contains copper (Cu) and a silicon oxynitride (SiON) film is used as the insulating film 14, it is most preferable that the composition ratio between Si (silicon) and N (nitrogen) in the insulating film 14, that is the ratio of the number of N (nitrogen) atoms to that of Si (silicon) atoms in the insulating film 14 be not less than 0.01 and not more than 0.2. In this case, in the insulating film 14, the nitrogen (N) content is not less than 1% and not more than 2% of the silicon (Si) content in terms of the ratio of the numbers of atoms. If the composition of the insulating film 14 is represented by $SiO_xN_y$, then, y in the $SiO_xN_y$ is not less than 0.01 and not more than 0.2 ($0.01 \leqq y \leqq 0.2$). Due to this, it is possible to make the effect of improvement of dielectric breakdown resistance between the plug 13c and the wire 20b by strengthening the property of barrier against copper of the insulating film 14 consistent with the effect of reduction in the parasitic capacitance between the wires 20.

When the plug 13 does not contain copper (Cu), for example, when the main conductor film 13b constituting the plug 13 contains tungsten (W) as a principal component, it is not necessary to pay attention to the diffusion of copper from the plug 13, and therefore, either a silicon oxide ($SiO_x$) film or a silicon oxynitride (SiON) film may be used as the insulating film 14, however, it is preferable to use a silicon oxide ($SiO_x$) film, taking the dielectric constant into consideration. Since the dielectric constant of the silicon oxide ($SiO_x$) film can be reduced more than that of the silicon oxynitride (SiON) film, it is possible to further reduce the parasitic capacitance between the wires 20 by using a silicon oxide ($SiO_x$) film as the insulating film 14.

Next, the semiconductor substrate 1 is arranged in a processing chamber of a plasma CVD apparatus and the semiconductor substrate 1 (in particular, the CMP surface on which the wire 20 is exposed) is subjected to the ammonia ($NH_3$) plasma treatment by introducing ammonia gas and applying a plasma power supply. Alternatively, $N_2$ gas and $H_2$ gas are introduced and the $N_2/H_2$ plasma treatment is carried out. By such a reductive plasma treatment, the copper oxide ($CuO$, $Cu_2O$, $CuO_2$) over the surface of the copper wire oxidized by CMP is reduced to copper (Cu) and further, a copper nitride (CuN) layer is formed over the surface (in a very thin region) of the wire 20.

Figure 13:
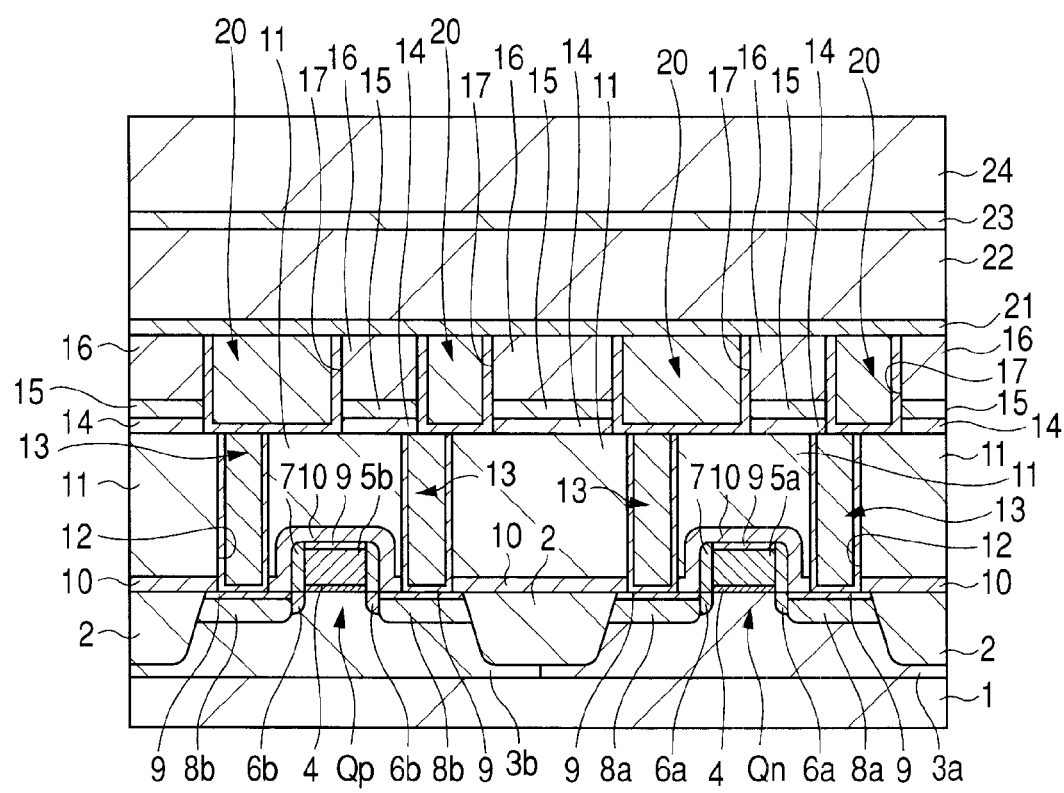
FIG. 13 is a cross-sectional view of essential parts in the manufacturing process of the semiconductor device, following FIG. 12.

Then, as shown in FIG. 13, an insulating film 21 is formed over the entire surface of the main surface of the semiconductor substrate 1 (that is, over the insulating film 16 including the top surface of the wire 20). The insulating film 21 functions as a barrier insulating film in a copper wire. As a result, the insulating film 21 inhibits or prevents the copper in the main conductor film 19 of the wire 20 from diffusing into an insulating film (interlayer insulating film) 22, which is formed later. It is preferable to use a material film excellent in the property of barrier against copper (capability of inhibiting or preventing the diffusion of copper is high) as the insulating film 21, and for example, it is preferable to use a silicon nitride (SiN) film, a silicon carbide (SiC) film, or a silicon carbonitride (SiCN) film and it is possible to form it by, for example, the plasma CVD method etc.

In addition, the silicon oxynitride (SiON) film also has a function of inhibiting or preventing the diffusion of copper (Cu). Because of this, if a silicon oxynitride (SiON) film is used as the insulating film 16, that is, if the insulating film 16 contains silicon (Si), oxygen (O), and nitrogen (N), it is possible to give the function of inhibiting or preventing the diffusion of copper (Cu) not only to the insulating film 22 but also to the insulating film 16 and to further inhibit or prevent a dielectric breakdown path from being formed at the interface of the insulating film 16 and the insulating film 21 between the neighboring wires 20. Due to this, it is possible to further improve the reliability of the wire.

Next, the insulating film (interlayer insulating film) 22, an insulating film (etching stopper film) 23, and an insulating film (interlayer insulating film) 24 are formed in order over the insulating film 21. The insulating films (interlayer insulating films) 22, 24 can be formed from the same material as that of the insulating film 16 and the insulating film (etching stopper film) 23 can be formed from the same material as that of the insulating film 15.

Figure 14:
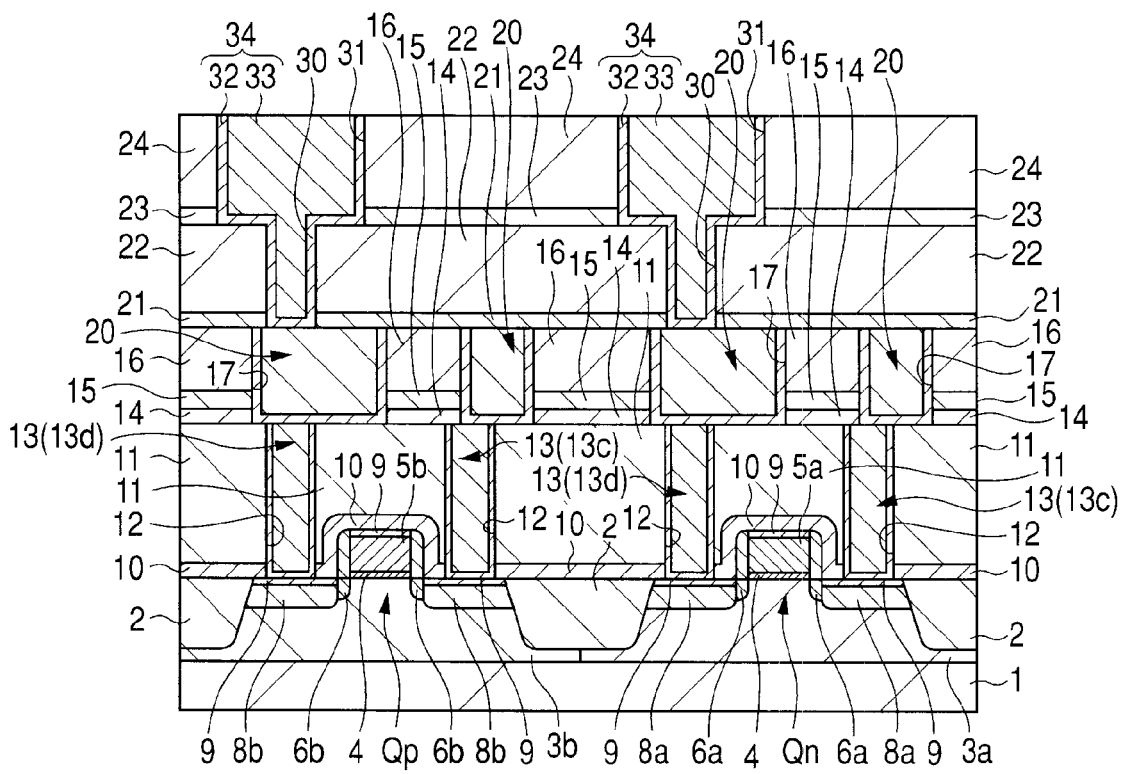
FIG. 14 is a cross-sectional view of essential parts in the manufacturing process of the semiconductor device, following FIG. 13.

Next, as shown in FIG. 14, wire openings, that is, an opening (via) 30 that reaches the wire 20 and an opening (wire groove) 31 are formed by dry etching the insulating films 21 to 24 using the photolithography method and the dry etching method. The opening 31 is formed by selectively removing the insulating film 24 and the insulating film 23. The opening 30 is formed by selectively removing the insulating film 22 and the insulating film 21 at the bottom of the opening 31. At the bottom of the opening 30, the top surface of the wire 20 is exposed.

Next, processing of cleaning the top surface over which the wire 20 is exposed is carried out by removing the copper oxide formed over the surface of the wire 20 (lower layer copper wire) exposed at the bottom of the opening 30. This can be done by reducing the copper oxide ($CuO$, $Cu_2O$, $CuO_2$) over the surface of the copper wire to copper (Cu) by the reductive plasma treatment, such as, for example, the hydrogen ($H_2$) plasma treatment.

Next, over the entire surface of the main surface of the semiconductor substrate 1 (that is, over the insulating film 24 including the opening 30 and the bottom surface and the sidewall of the opening 31), a thin conductive barrier film (barrier conductor film) 32 including the same material (for example, titan nitride) as that of the conductive barrier film 18 is formed using the same method. The conductive barrier film 32 has the same functions as those of the conductive barrier film 18, such as, for example, the function of inhibiting or preventing the diffusion of copper of a main conductor film 33, to be described later, the function of improving the close adhesion between the main conductor film 33 and the insulating film (the insulating films 21 to 24).

Next, over the conductive barrier film 32, the main conductor film 33 including the same material (copper) as that of the above-mentioned main conductor film 19 is formed so that it fills the opening 30 and the opening 31 using the same method. Then, for example, in a non-oxidizing atmosphere (for example, a hydrogen atmosphere), the semiconductor substrate 1 is subjected to thermal treatment and the crystal grains of the main conductor film 33 are caused to grow.

Next, the main conductor film 33 and the conductive barrier film 32 are polished by, for example, the CMP method until the top surface of the insulating film 24 is exposed. A wire (second layer wire) 34 including the relatively thin conductive barrier film 32 and the relatively thick main conductor film 33 is formed in the wire opening including the opening (wire groove) 31 and the opening (via) 30 by removing the unnecessary conductive barrier film 32 and main conductor film 33 over the insulating film 24 and leaving the conductive barrier film 32 and the main conductor film 33 in the openings 30, 31 as a wire opening. The wire 34 has a wire part including the conductive barrier film 32 and the main conductor film 33 embedded in the opening (wire groove) 31 and a via part including the conductive barrier film 32 and the main conductor film 33 embedded in the opening (via) 31 and the wire part of the wire 34 is electrically coupled with the wire 20, which is the lower layer wire, via the via part of the wire 34.

Then, the same processes as those in FIG. 13 and FIG. 14 are repeated as needed and thus the upper layer wire after the third layer wire can be formed, however, they are not shown schematically and their description is omitted here.

Figure 15:
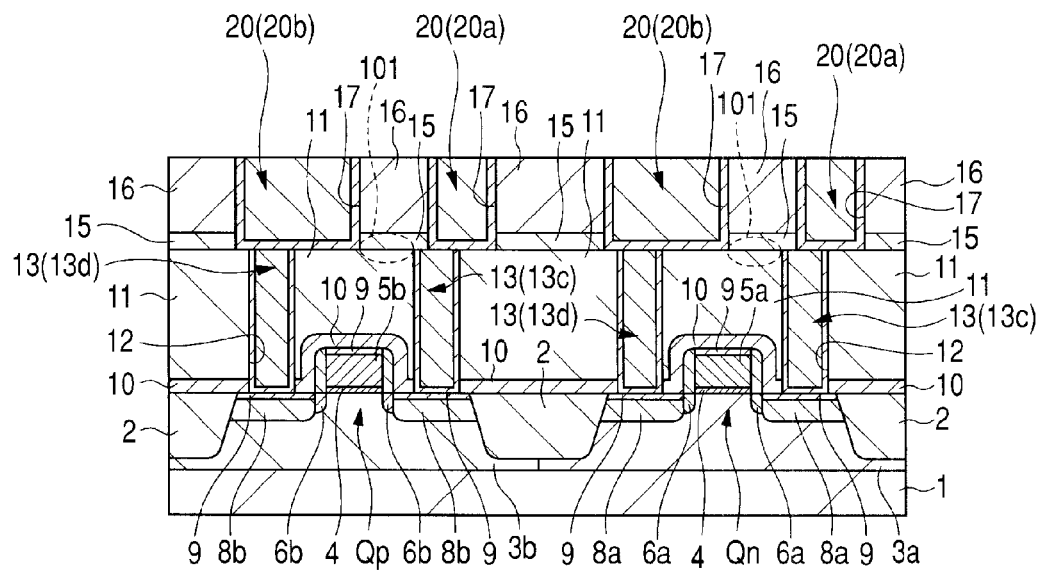
FIG. 15 is a cross-sectional view of essential parts in a manufacturing process of a semiconductor device in a first comparative example.

In the semiconductor device according to the present embodiment, as shown in FIG. 15, over the main surface of the semiconductor substrate 1, a semiconductor element including a MISFET, such as MISFET Qn, Qp, is formed and over the main surface of the semiconductor substrate 1 on which the semiconductor element (MISFET Qn, Qp, etc.) is formed, the insulating films 10, 11 (first insulating film) are formed. The insulating film 11 (first insulating film) is formed over the main surface of the semiconductor substrate 1 on which the semiconductor element such as MISFET is formed so that it fills the gap between the gate electrodes of the MISFET (between the gate electrodes 5a, 5b, here). In the insulating films 10, 11, the contact hole 12 (first opening) is formed and in the contact hole 12, the plug 13 (first conductor part) is embedded. The bottom of the plug 13 is electrically coupled with the source region or the drain region of the MISFET or the gate electrode. Over the insulating film 11, the insulating film 14 is formed, over the insulating film 14, the insulating film 15 is formed, and over the insulating film 15, the insulating film 16 is formed. The insulating film 14 has a higher density of the number of Si (silicon) atoms than that of the insulating film 11 and is less hygroscopic than the insulating film 11. The insulating film 11 and the insulating film 15 are not in direct contact but the insulating film 14 is interposed in between. In the insulating films 14, 15, 16, the opening 17 (wire opening) is formed and in the opening 17, the wire 20 (first wire) is embedded. At the bottom of the opening 17, at least part of (the top surface of) the plug 13 is exposed and the wire 20 is in contact and electrically coupled with the plug 13. The wire 20 includes the wire layer of the lowest layer of the plurality of wire layers formed over the semiconductor substrate 1. Since a material constituting the respective insulating films 10, 11, 14, 15, 16 has already been described above, their description is omitted here.

The insulating film 15 is an etching stopper film when etching the insulating film 16 to form the opening 17 (wire opening) and it is preferable to use a material film capable of increasing the etching selection ratio and a material film capable of reducing dielectric constant because the insulating film 16 functions as an interlayer insulating film. Because of this, it is preferable that the dielectric constant of the insulating film 16 be lower than that of the insulating film 15. In the manufactured semiconductor device, it is also preferable that the film thickness of the insulating film 16 be larger than that of the insulating film 15 and larger than that of the insulating film 14. By making the insulating film 16 the dielectric constant of which can be easily reduced thickest of the insulating films 14, 15, 16, it is possible to efficiently reduce the parasitic capacitance between the neighboring wires 20. Here, each film thickness of the insulating films 14, 15, 16 corresponds to the film thickness in the direction perpendicular to the main surface of the semiconductor substrate 1.

Next, the effects of the present embodiment will be described in greater detail.

Figure 16:
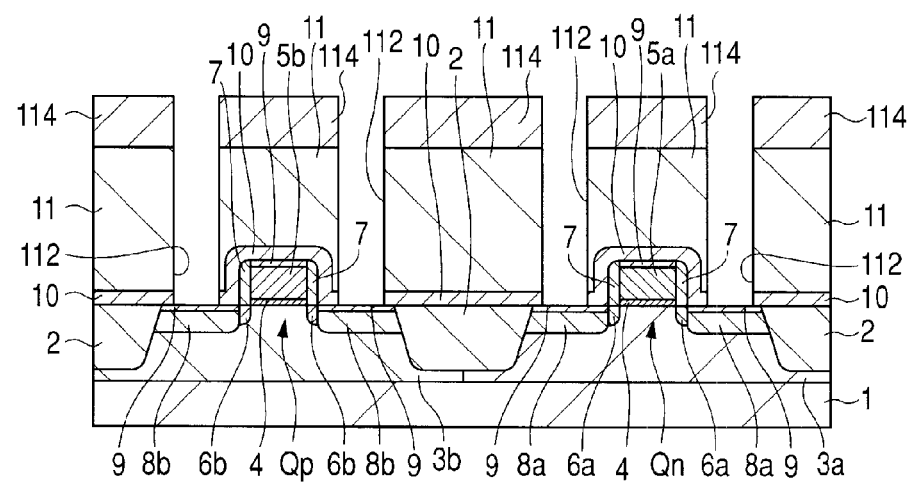
FIG. 16 is a cross-sectional view of essential parts in a manufacturing process of a semiconductor device in a second comparative example.
Figure 17:
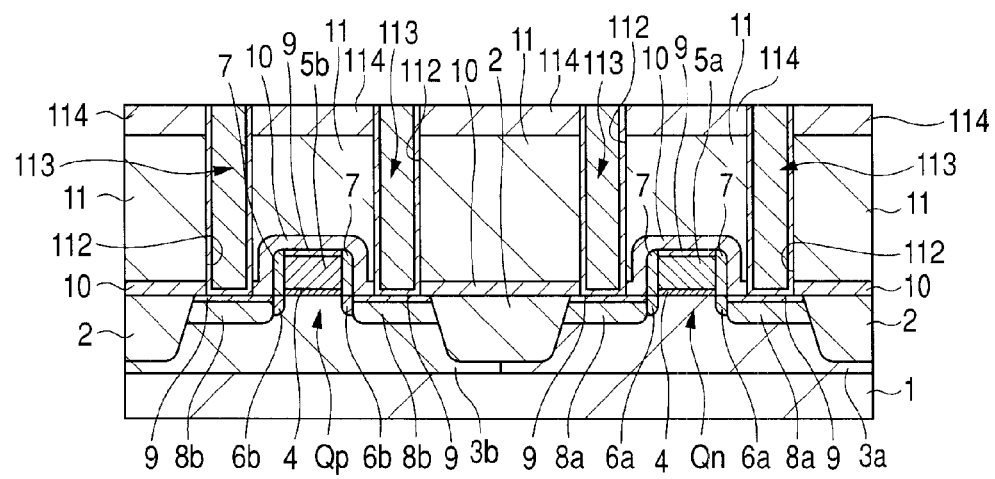
FIG. 17 is a cross-sectional view of essential parts in the manufacturing process of the semiconductor device in the second comparative example, following FIG. 16.
Figure 18:
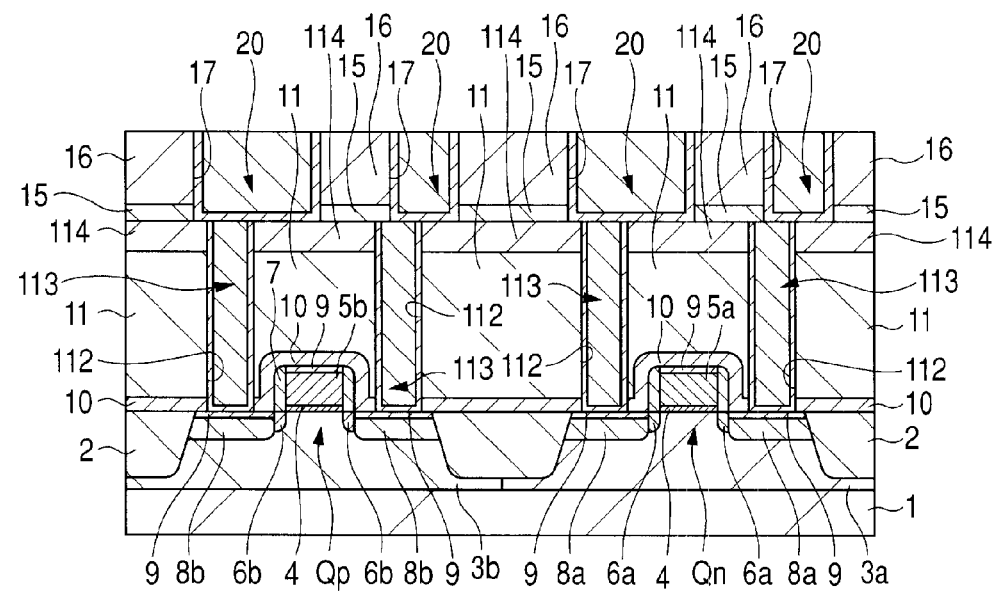
FIG. 18 is a cross-sectional view of essential parts in the manufacturing process of the semiconductor device in the second comparative example, following FIG. 17.

FIG. 15 is a cross-sectional view of essential parts in the manufacturing process of a semiconductor device in a first comparative example the present inventors have examined, corresponding to FIG. 12 according to the present embodiment. FIG. 16 to FIG. 18 are cross-sectional views of essential parts in the manufacturing process of a semiconductor device in a second comparative example the present inventors have examined, corresponding to FIG. 6, FIG. 7, and FIG. 12 according to the present embodiment, respectively.

The first comparative example in FIG. 15 differs from the present embodiment in that the formation of the insulating film 14 is omitted but the insulating film 15 as an etching stopper film and the insulating film 16 as an interlayer insulating film are formed over the insulating film 11 in which the plug 13 is embedded, and the opening 17 and the wire 20 with which the opening 17 is filled are formed in the insulating films 15, 16. Other parts are manufactured in the same manner as the present embodiment.

In the first and second comparative examples according to the present embodiment, after the semiconductor element, such as MISFET Qn, Qp, etc., is formed in the main surface of the semiconductor substrate 1, the insulating film 11 as an interlayer insulating film is formed over the main surface of the semiconductor substrate 1. It is desired to use an insulating film excellent in the embeddability as the insulating film 11 to be formed so that it fills the space between the gate electrodes. Because of this, an insulating film, such as an $O_3$-TEOS oxide film formed by the thermal CVD method or an insulating film such as an SOG film formed by the coating method, which is excellent in the embeddability, is used as the insulating film 11. However, an insulating film with a high embeddability is less fine compared to an insulating film formed by the plasma CVD method, its density of the number of Si (silicon) atoms is lower, and is more hygroscopic, and therefore, it tends to have a high moisture content when formed. In particular, when a nickel silicide layer is used as the metal silicide layer 9, due to the restrictions of the heat resistance of the nickel silicide (about 500° C.), annealing (thermal treatment) cannot be carried out at high temperatures (for example, 800° C. or higher) after the insulating film 11 is formed, and therefore, it is difficult to improve the hygroscopicity of the insulating film 11 (to make the insulating film 11 less hygroscopic) by annealing. Because of this, the subsequent processes are carried out in the state in which the insulating film 11 is very hygroscopic and other insulating films are formed over the insulating film 11.

In the first comparative example in FIG. 15, unlike the present embodiment, the insulating film 14 is not formed but the insulating film 15 as an etching stopper film is formed over the insulating film 11 in which the plug 13 is embedded, however, if a silicon carbide (SiC) base material is used as the insulating film 15, a high etching selection ratio and a low dielectric constant can be realized but the insulating film 15 becomes less moisture resistant and the electric characteristics are more likely to deteriorate due to moisture absorption.

The present inventors have examined and found that if the insulating film 11 that tends to have a high moisture content is in direct contact with the less hygroscopic insulating film 15, as shown in the first comparative example in FIG. 15, the interface (interface between the insulating film 11 and the insulating film 15 in the first comparative example) becomes electrically weak and the dielectric breakdown is likely to occur via the interface even if there is no diffusion of copper (Cu) in the copper wire. In other words, we have found that the dielectric breakdown is likely to occur at the interface between the insulating film 11 and the insulating film 15 at a part 101 enclosed by the dotted line in FIG. 15.

In the first comparative example in FIG. 15, as in the present embodiment, the misalignment between the opening 17 and the plug 13 is accepted and only part of the top surface of the plug 13c of the plugs 13 is exposed at the bottom of the opening 17 and comes into contact with the wire 20 and the other part of the top surface is covered with the laminated film of the insulating films 15, 16. In such a case, the distance between the plug 13c and the wire 20b neighboring the wire 20a coupled with the plug 13c becomes shorter than the distance between the wire 20a and the wire 20b (the closest distance between the wires 20), and therefore, dielectric breakdown is more likely to occur between the plug 13c and the wire 20b close to each other. The present inventors have found that in the first comparative example in FIG. 15, dielectric breakdown between the plug 13 and the wire 20b close to each other is more likely to occur at the part 101 enclosed by the dotted line in FIG. 15 via the interface between the insulating film 11 and the insulating film 15.

Then, a case can be thought, where, unlike the first comparative example and the present embodiment, a silicon nitride film excellent in moisture resistance is used as the insulating film 15 as an etching stopper film, however, in this case, the dielectric constant of the insulating film increases and the parasitic capacitance between the neighboring wires 20 also increases.

In addition, a case can be thought, where, unlike the first comparative example and the present embodiment, the formation of the insulating film 15 as an etching stopper film is omitted, however, if the insulating film 15 as an etching stopper film is omitted, the depth of the groove (opening 17) for forming the wire fluctuates due to the variations in the amount of etching and the pattern dependency of the wire groove, resulting in an increase in variations in the wire resistance and capacitance between wires or reduction in the reliability of the electric contact between the plug 13 and the wire 20, and there is the possibility that the production yield of the semiconductor device may be lowered. Because of this, it is desirable to form the insulating film 15 as an etching stopper film under the insulating film 16.

Then, it can be thought that as shown in the second comparative example shown in FIG. 16, after the insulating film 11 that tends to have a high moisture content is formed, an insulating film 114 with a high moisture resistance, such as a silicon oxide film formed by the plasma CVD method, is formed over the insulating film 11 and then a contact hole 112 (corresponding to the contact hole 12 in the present embodiment) is formed in the insulating films 114, 11, 10. Then, in the second comparative example, as shown in FIG. 17, after a plug 113 (corresponding to the plug 13 in the present embodiment) to be embedded in the contact hole 112 is formed, the insulating films 15, 16 are formed over the insulating film 114 in which the plug 113 is embedded without the formation of the insulating film 14 and the opening 17 and the wire 20 are formed in the insulating films 15, 16, as shown in FIG. 18. Because of this, while the opening 17 in which the wire 20 is embedded is formed (opened) in the insulating films 14, 15, 16 in the present embodiment, as shown in FIG. 12 etc., the opening 17 in which the wire 20 is embedded is formed in the insulating films 15, 16 but not formed (opened) in the insulating film 114 in the second comparative example, as shown in FIG. 18.

In the second comparative example in FIG. 16 to FIG. 18, the insulating film 114 with a high moisture resistance is interposed between the insulating film 11 that tends to have a high moisture content and the insulating film 15 with a low moisture resistance and the insulating film 11 and the insulating film 15 are not in direct contact. In other words, the insulating film 15 with a low moisture resistance is not in contact with the insulating film 11 that tends to have a high moisture content. Because of this, as in the first comparative example in FIG. 15 described above, it is possible to prevent dielectric breakdown via the interface between the insulating film 11 and the insulating film 15, which has become electrically weak.

However, in the second comparative example in FIG. 16 to FIG. 18, it is necessary to form the contact hole 112 in the insulating films 10, 11, 114 and embed the plug 113 therein. While it is only necessary to form the contact hole 12 in the insulating films 10, 11 in the present embodiment and the first comparative example in FIG. 15, the contact hole 112 is formed in the insulating films 10, 11, 114 in the second comparative example in FIG. 16 to FIG. 18, and therefore, the depth of the contact hole 112 is increased by the amount of the film thickness of the insulating film 114. Further, it is also necessary to make considerably large the film thickness of the insulating film 114 when the contact hole 112 is formed, as shown in FIG. 16, in order for the insulating film 114 to remain over the entire surface of the insulating film 11, as shown in FIG. 17, even if the top of the insulating film 114 is cut together because of the improper selectivity of polishing in the polishing (CMP) process of the conductor film (corresponding to the main conductor film 13b and the conductive barrier film 13a in the present embodiment) for the plug 113 when the plug 113 is formed. In addition, it is also necessary to make considerably large the film thickness of the insulating film 114 when the contact hole 112 is formed, as shown in FIG. 16, in order to prevent without fail the top surface of the insulating film 11 from being exposed, as shown in FIG. 17, even if the evenness of polishing being taken into account.

Because of this, compared to the contact hole 12 in the present embodiment and the first comparative example in FIG. 15, the contact hole 112 in the second comparative example is deeper and the aspect ratio is larger. When the contact hole and the plug are formed in the insulating film, the thicker the insulating film becomes and the deeper the contact hole becomes (the larger the aspect ratio of the contact hole becomes), the higher the possibility is that insufficient machining of the contact hole or insufficient embedding of the conductor film for plug in the contact hole may occur. As a result, compared to the present embodiment and the first comparative example in FIG. 15, in the second comparative example in FIG. 16 to FIG. 18, in which the film thickness of the insulating film that forms the contact hole and the plug is large, the production yield of the semiconductor device is lowered.

In contrast to this, in the present embodiment, the contact hole 12 is formed in the insulating films 10, 11 and the plug 13 is embedded therein. In other words, in the present embodiment, the contact hole 12 is formed in the insulating films 10, 11, however, the contact hole 12 is not formed in the insulating film 14. Because of this, compared to the second comparative example in FIG. 16 to FIG. 18, in which the contact hole 112 is formed in the insulating films 10, 11, 114, in the present embodiment, in the present embodiment, the insulating film 114 is not necessary and accordingly, the thickness of the insulating film (corresponding to the total thickness of the insulating films 10, 11 in the present embodiment) in which the contact hole 12 is formed can be reduced. It is therefore possible to prevent the contact hole 12 from being formed defectively in the dry etching process for forming the contact hole 12 and to prevent the conductor film (the conductive barrier film 13a and the main conductor film 13b) for plug from being embedded defectively in the contact hole 12, and thus the production yield of the semiconductor device can be improved.

Further, in the present embodiment, the insulating film 14 is formed over the insulating film 11 in which the plug 13 is embedded, the insulating films 15, 16 are formed over the insulating film 14, and the wire opening (the opening 17) is formed in the insulating films 14, 15, 16 and the wire 20 is embedded therein. As described above, although the insulating film 11 tends to have a high moisture content and the insulating film 15 has a low moisture resistance, in the present embodiment, the insulating film 14 is interposed between the insulating film 11 and the insulating film 15 so that the insulating film 11 and the insulating film 15 are not in contact, and therefore, it is possible to prevent the insulating film 11 that tends to have a high moisture content from coming into direct contact with the insulating film 15 with a low moisture resistance.

Then, in the present embodiment, the insulating film 14 interposed between the insulating film 11 and the insulating film 15 is formed by the plasma CVD method so that it has a higher density of the number of Si (silicon) atoms than that of the insulating film 11 and thereby the insulating film 14 is made to be an insulating film less hygroscopic and excellent in moisture resistance. As a result, the insulating film 11 that tends to have a high moisture content is covered with the insulating film 14 with a higher density of the number of Si (silicon) atoms and more excellent in moisture resistance than the insulating film 11, and therefore, the interface between the insulating film 11 and the insulating film 14 does not become electrically weak and it is possible to prevent dielectric breakdown via the interface between the insulating film 11 and the insulating film 14. Further, the insulating film 15 with a low moisture resistance is formed over the insulating film 14 with a higher density of the number of Si (silicon) atoms and less hygroscopic than the insulating film 11, and therefore, the interface between the insulating film 15 and the insulating film 14 does not become electrically weak and it is possible to prevent dielectric breakdown via the interface between the insulating film 15 and the insulating film 14. In other words, it is possible to prevent an interface (insulating film interface) that will otherwise serve as a dielectric breakdown path when becoming electrically weak from being formed. As a result, it is possible to improve the dielectric breakdown resistance between the wires 20, to improve the reliability of the wire, and to improve the reliability of the semiconductor device.

In the present embodiment, as described above, even if the distance between the plug 13c and the wire 20b becomes shorter than the closest distance between the wires 20 (the distance between the wire 20a and the wire 20b) due to the misalignment between the opening 17 and the plug 13, it is possible to prevent an electrically weak dielectric breakdown path from being formed between the plug 13c and the wire 20b close to each other because the insulating film 14 is formed between the insulating film 11 and the insulating film 15, and thus the dielectric breakdown resistance between the plug 13c and the wire 20b can be improved. Because of this, it is possible to improve the reliability of the semiconductor device having a plug and a wire. In addition, since the margin for the alignment between the opening 17 and the plug 13 can be reduced, it is possible to make an attempt to make the semiconductor device finer and more compact. As a result, it is more effective to apply the present embodiment to a semiconductor device having the plug 13c in the state in which a misalignment between the opening 17 and the plug 13 is accepted, only part of the top surface thereof is exposed at the bottom of the opening 17 and comes into contact with the wire 20, and the other part of the top surface thereof is covered with the insulating film 14 (laminated layer of the insulating films 14, 15, 16), as shown in FIG. 12 etc. This also applies to a second embodiment, to be described below.

In the present embodiment, since the dielectric breakdown resistance between the plug 13 and the wire 20 can be improved, it is more effective to apply to a semiconductor device having an embedded wire (here, the wire 20) in the lowest layer wire (first layer wire). This also applies to the second embodiment, to be described later.

In the present embodiment, since the insulating film 14 that is finer than the insulating film 11 and has a higher density of the number of Si (silicon) atoms than that of the insulating film 11 is interposed between the insulating film 11 and the insulating film 15, even if the insulating film 11 has a low density of the number of Si (silicon) atoms and is more hygroscopic, a trouble resulting from that can be prevented, it is more effective to apply the present embodiment to the case where the insulating film 11 is a film with a low density of the number of Si (silicon) atoms. Because of this, it is more effective to apply the present embodiment (the insulating film 14 is formed between the insulating film 11 and the insulating film 15) to both the case where the insulating film 11 is formed by the thermal CVD method (in particular, when the insulating film 11 is an $O_3$-TEOS oxide film) and the case where the insulating film 11 is formed by the coating method (in particular, when the insulating film 11 is an SOG film) because the insulating film 11 has a high embeddability but a low density of the number of Si (silicon) atoms and tends to have a high hygroscopicity. In particular, an insulating film (silicon oxide film), such as an SOG film, formed by the coating method, tends to have a lower density of the number of Si (silicon) atoms and to be more hygroscopic than an insulating film (silicon oxide film), such as an $O_3$-TEOS oxide film, formed by the thermal CVD method, and therefore, if the present embodiment is applied (if the insulating film 14 is formed between the insulating film 11 and the insulating film 15) to the case where an insulating film, such as an SOG film, formed by the coating method is used as the insulating film 11, a very significant effect can be obtained.

When the metal silicide layer 9 includes a nickel silicide, due to the restrictions of the heat resistance of the nickel silicide (about 500° C.), annealing (thermal treatment) at higher temperatures than that cannot be carried out after the insulating film 11 is formed and therefore it is difficult to improve the hygroscopicity (to make less hygroscopic) of the insulating film 11. However, in the present embodiment, even if improvement of the hygroscopicity (to make less hygroscopic) of the insulating film 11 by a high temperature annealing cannot be carried out, it is possible to prevent a trouble resulting from the high hygroscopicity of the insulating film 11 from occurring by interposing the insulating film 14 between the insulating film 11 and the insulating film 15. Because of this, it is more effective to apply the present embodiment to the case where the metal silicide layer 9 includes a nickel silicide. This also applies to the second embodiment, to be described below.

In the present embodiment and the second embodiment, to be described later, the case is described, where the metal silicide layer 9 is formed over both the surface (top surface, top) of the semiconductor region for source or drain that constitutes a MISFET and the surface (top surface, top) of the gate electrode, however, the embodiments can be applied to the case where the metal silicide layer 9 is formed over one of the surfaces. In other words, a significant effect can be obtained if the present embodiment and the second embodiment, to be described later, are applied to the case where the metal silicide layer 9 is formed over either of the surface (surface layer part, upper layer part, top) of the semiconductor region for source or drain that constitutes a MISFET and the surface (surface layer part, upper layer part, top) of the gate electrode.

Second Embodiment

FIG. 19 to FIG. 23 are cross-sectional views of essential parts in a manufacturing process of a semiconductor device according to the present embodiment. The processes up to that in FIG. 4 are substantially the same as those in the first embodiment described above, and therefore, their description is omitted here and subsequent processes that follow that in FIG. 4 are described.

Figure 19:
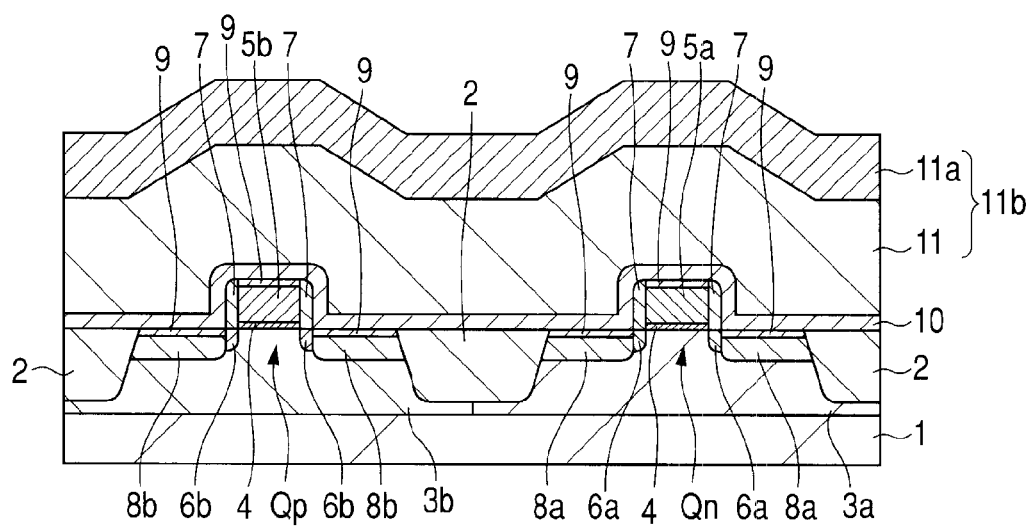
FIG. 19 is a cross-sectional view of essential parts in a manufacturing process of a semiconductor device according to another embodiment of the present invention.

After substantially the same structure as that in FIG. 4 is obtained by carrying out the processes up to the film forming process of the insulating film 11 in the same manner as that in the first embodiment, in the present embodiment, an insulating film 11*a* (sixth insulating film) 11*a* is formed over the insulating film (first insulating film) 11, as shown in FIG. 19. The insulating film 11*a* includes a silicon oxide film formed by the plasma CVD method. Since the gap between gate electrodes 5*a*, 5*b* is filled with the insulating film 11, no problem about embeddability will arise even if the Insulating film 11*a* is formed by the plasma CVD method.

Figure 20:
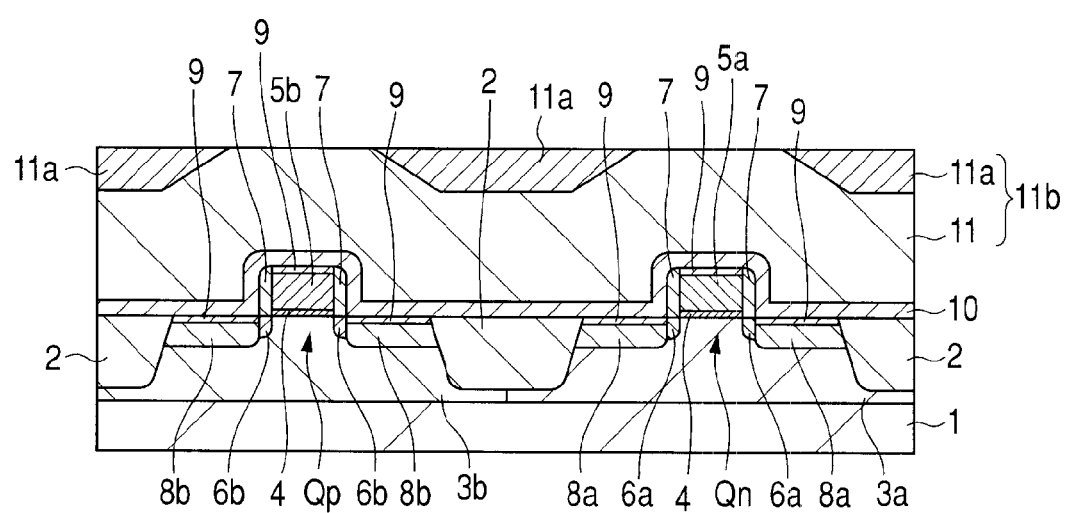
FIG. 20 is a cross-sectional view of essential parts in the manufacturing process of the semiconductor device, following FIG. 19.

Next, as shown in FIG. 20, the top surface of a laminated film (first laminated film) 11*b* of the insulating films 11, 11*a* is polished and flattened using the CMP method etc. At this time, the CMP processing of the insulating film 11*a* is carried out until part of the insulating film 11 is exposed. Due to this, the polished surface (the polished top surface of the laminated film 11*b*) is flattened and a state in which the insulating film 11 is partially exposed, that is, a state in which both the insulating film 11 and the insulating film 11*a* are exposed is brought about.

The reason that the insulating film 11 is partially exposed on the top surface of the polished and flattened laminated film 11*b* is that the top surface of the insulating film 11 is not flat and some part is raised in the region in the vicinity of the gate electrodes 5*a*, 5*b* reflecting the backing shape (the convex shape of the gate electrodes 5*a*, 5*b* and the sidewall 7) in the stage where the insulating film 11 is formed as shown in FIG. 4. Because of this, as shown in FIG. 20, in the stage where the insulating films 11*a*, 11 are subjected to the CMP processing, the polished surface is in a state in which the insulating film 11 is exposed in the region in the vicinity of the gate electrodes 5*a*, 5*b* and the insulating film 11*a* is exposed in the peripheral region (region between gate electrodes).

Figure 21:
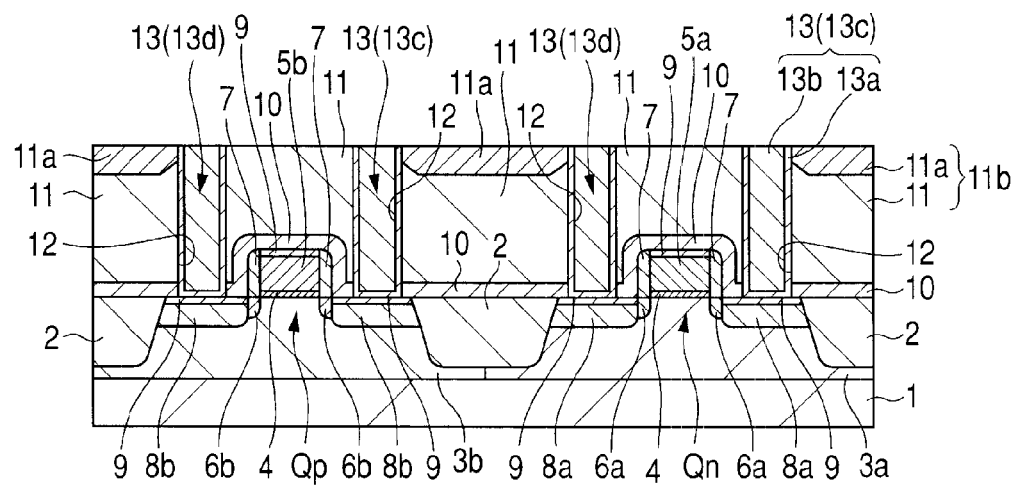
FIG. 21 is a cross-sectional view of essential parts in the manufacturing process of the semiconductor device, following FIG. 20.

Next, in substantially the same manner as that in the first embodiment, after the contact hole 12 is formed in the insulating films 10, 11, 11*a* (the insulating film 10 and the laminated film 11*b*), the plug 13 is formed in the contact hole 12 as shown in FIG. 21 (corresponding to FIG. 7 in the first embodiment). In addition, in the present embodiment, as will also be seen from FIG. 21, the contact hole 12 and the plug 13 with which the contact hole 12 is filled are formed also at the position that overlaps with the part of the top surface of the polished and flattened laminated film 11*b* where the insulating film 11 is exposed. At least part of the top surface of the plug 13 formed at the position that overlaps the part of the top surface of the laminated film 11*b* where the insulating film 11 is exposed neighbors (is in contact with) the insulating film 11.

Figure 22:
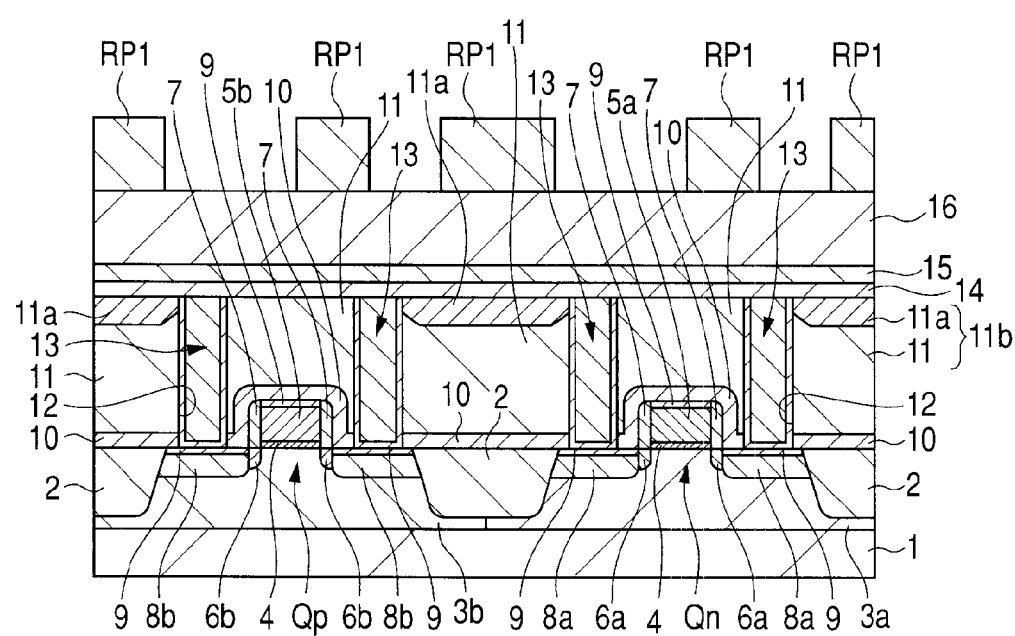
FIG. 22 is a cross-sectional view of essential parts in the manufacturing process of the semiconductor device, following FIG. 21.
Figure 23:
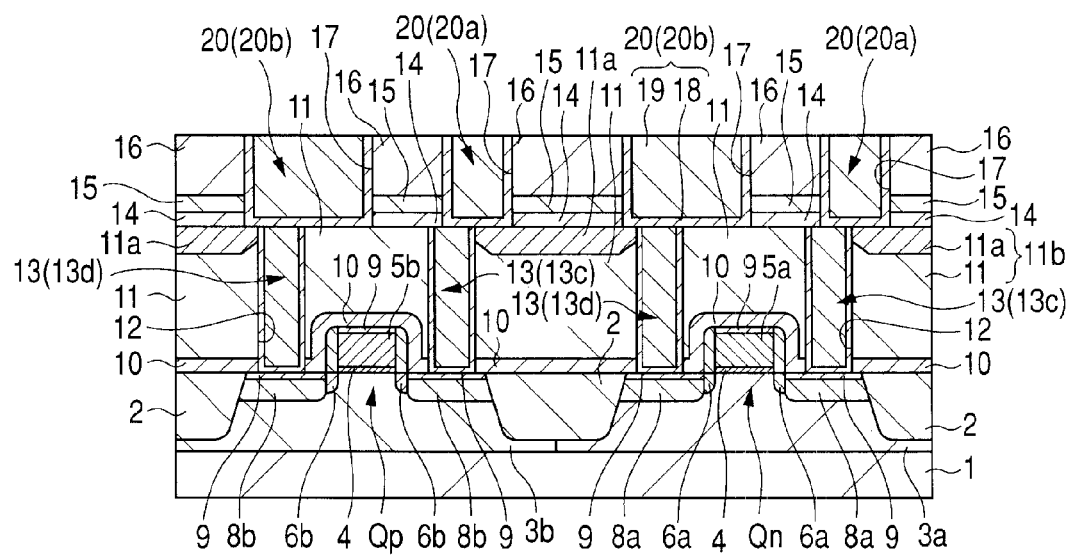
FIG. 23 is a cross-sectional view of essential parts in the manufacturing process of the semiconductor device, following FIG. 22.

The processes after this are the same as those in the first embodiment described above. In other words, the insulating film 14 is formed over the top surface of the laminated film 11*b* (the insulating films 11, 11*a*) in which the plug 13 is embedded, the insulating film 15 is formed over the insulating film 14, the insulating film 16 is formed over the insulating film 15, and the resist pattern RP1 is formed over the insulating film 16 as in the first embodiment, as shown in FIG. 22 (corresponding to FIG. 8 in the first embodiment). Since the insulating films 14, 15, 16 are the same as those in the first embodiment, their description is omitted here. Then, the opening 17 is formed in the insulating films 14, 15, 16 as in the first embodiment, as shown in FIG. 23 (corresponding to FIG. 12 in the first embodiment). At this time, as in the first embodiment, the insulating film 16 is etched and the insulating film 15 of the lower layer is caused to function as an etching stopper and then the insulating films 15, 14 are etched and the opening 17 is formed in the insulating films 14, 15, 16. Then, as in the first embodiment, the wire 20 is formed in the opening 17.

After this, in the same manner as that in the first embodiment, insulating films 22, 23, 24, the openings 30, 31, and the wire 34 are formed, however, they are not shown schematically and their description is omitted here.

In the above-mentioned first embodiment, the contact hole 12 and the plug 13 are formed in the insulating film 11 (or the laminated film of the insulating films 10, 11) and the insulating film 14 is formed over the entire surface of the top surface of the insulating film 11 in which the plug 13 is embedded.

In contrast to this, in the present embodiment, after the insulating film 11 the top surface of which is not flat is formed, the insulating film 11*a* is formed over the insulating film 11, the top surface of the laminated film (first laminated film) including the insulating film 11 and the insulating film 11*a* is polished and flattened, and the insulating film 11 is partially exposed over the top surface of the flattened laminated film 11*b*. Then, the contact hole 12 is formed in the insulating film 10 and the laminated film 11*b* and the plug 13 is embedded therein and the insulating film 14 is formed over the laminated film 11*b* in which the plug 13 is embedded.

As a result, the produced semiconductor device according to the present embodiment is, as also shown in FIG. 23, in a state in which the laminated film 11*b* including the insulating film 11 and the insulating film 11*a* formed partially over the top of the insulating film 11 is formed over the main surface of the semiconductor substrate 1, the top surface of the laminated film 11*b* is flattened, and the insulating film 11 is partially exposed over the flattened top surface of the laminated film 11*b*, and the contact hole 12 and the plug 13 are formed in the laminated film 11*b*. The insulating film 14 is formed over the laminated film 11*b*. The contact hole 12 and the plug 13 with which the contact hole 12 is filled are formed also at the position that overlaps with (at least part of) the part of the top surface of the laminated film 11*b* where the insulating film 11 is exposed and the insulating film 11 (that is, the part of the top surface of the laminated film 11*b* where the insulating film 11 is exposed) neighbors (at least part of) the top surface of the plug 13 and in contact therewith.

In the present embodiment, in the top surface of the polished and flattened laminated film 11*b*, the insulating film 11 is partially exposed and since the top surface of the laminated film 11*b* includes the top surface of the insulating film 11 and the top surface of the insulating film 11*a*, the undersurface of the insulating film 14 formed in the top surface of the laminated film 11b has a region in contact with the top surface of the insulating film 11 and a region in contact with the top surface of the insulating film 11a. If the formation of the insulating film 14 is omitted, unlike the present embodiment, the undersurface of the insulating film 15 comes into contact with the top surface of the laminated film 11b as a result, and the undersurface of the insulating film 15 will have a region in contact with the top surface of the insulating film 11 and a region in contact with the top surface of the insulating film 11a. As described in the above-mentioned first embodiment, if the insulating film 15 comes into contact with the insulating film 11, the interface becomes electrically weak and dielectric breakdown becomes more likely to occur via the interface, however, in the present embodiment, since the insulating film 14 is formed between the top surface of the laminated film 11b and the insulating film 15, it is possible to prevent dielectric breakdown via the interface between the insulating film 11 and the insulating film 15 by preventing the insulating film 15 from coming into contact with the insulating film 11. Because of this, it is possible to improve the dielectric breakdown resistance between the wires 20, to improve the reliability of the wire, and to improve the reliability of the semiconductor device.

It can also be thought that, unlike the present embodiment, when the top surface of the laminated film 11b including the insulating films 11, 11a is polished and flattened after the insulating films 11, 11a are formed, the CMP processing is terminated before the insulating film 11 is exposed and thus the insulating film 11 is not exposed in the top surface of the flattened laminated film 11b. However, in this case, since the top surface of the insulating film 11 is covered with the insulating film 11a, it is possible to prevent trouble resulting from the fact that the insulating film 11 tends to have a high moisture content, but on the other hand, the laminated film 11b in which the contact hole 12 is to be formed becomes thicker by the amount of the insulating film 11a left on the entire top surface of the insulating film 11, as in the second comparative example in FIG. 16 to FIG. 18. Because of this, the contact hole 12 becomes deeper, the aspect ratio of the contact hole 12 increases, and the possibility is increased that insufficient machining of the contact hole 12 or insufficient embedding of the conductor film for the plug 13 in the contact hole 12 may occur.

In contrast to this, in the present embodiment, after the insulating films 11, 11a are formed, the CMP processing is carried out until the insulating film 11 is partially exposed from the polished surface when the top surface of the laminated film 11b including the insulating films 11, 11a is polished and flattened, and the insulating film 11 is partially exposed in the top surface of the polished and flattened laminated film 11b. Because of this, since the thickness of the laminated film 11b in which the contact hole 12 is to be formed can be reduced compared to the case where the insulating film 11a is left over the entire top surface of the insulating film 11 and therefore it is possible to make the contact hole 12 shallower and reduce the aspect ratio, and prevent insufficient machining of the contact hole 12 and insufficient embedding of the conductor film for the plug 13 in the contact hole 12 from occurring. As a result, it is possible to improve production yield of the semiconductor device. Then, as in the above-mentioned first embodiment, in the present embodiment also, since the insulating film 11 is formed over the laminated film 11b in which the plug 13 is embedded, it is possible to prevent the trouble that the insulating film 11 is partially exposed over the top surface of the polished and flattened laminated film 11b.

In the case where the top surface of the insulating film 11 before the insulating film 11a is formed is flat and the insulating film 11a is formed over the flat surface of the insulating film 11, when the top surface of the laminated film 11b including the insulating films 11, 11a is polished and flattened, it is more likely that a state in which the insulating film 11a remains over the entire surface of the top surface of the insulating film 11 and the insulating film 11 is not at all exposed from the polished surface or a state in which all of the insulating film 11a is removed and the insulating film 11 is exposed over the entire surface may be brought about. Because of this, the present embodiment will be more effective if applied to the case where the flatness of the top surface of the insulating film 11 before the insulating film 11a is formed is low (for example, when the bumps and dips reflecting the gate electrodes 5a, 5b are generated in the top surface of the insulating film 11), and in this case, if the top surface of the laminated film 11b including the insulating films 11, 11a is polished and flattened after the insulating film 11a is formed in the top surface that is not flat of the insulating film 11, the insulating film 11 is partially exposed from the polished surface as shown in FIG. 20. Although the present embodiment can be applied to both the case where the insulating film 11 is formed by the thermal CVD method (for example, when the insulating film 11 is an $O_3$-TEOS oxide film) and the case where the insulating film 11 is formed by the coating method (for example, when the insulating film 11 is an SOG film), the present embodiment will be more effective, in particular, if applied to the case where the insulating film 11 is formed by the thermal CVD method, in which the flatness of the top surface of the insulating film 11 before the insulating film 11a is formed is more likely to be low (for example, the insulating film 11 is an $O_3$-TEOS oxide film).

As described in the above-mentioned first embodiment and the first comparative example, when the distance between the plug 13c and the wire 20b becomes shorter due to the misalignment between the opening 17 and the plug 13, the possibility is high that an electrically weak dielectric breakdown path is formed between the plug 13c and the wire 20b close to each other. Because of this, when the contact hole and the plug 13 to be embedded therein are formed only in the part of the top surface of the laminated film 11b where the insulating film 11a is exposed (that is, the plug 13 that has the top surface in contact with the insulating film 11 does not exist), the periphery of the top (top surface) of the plug 13 is surrounded by the insulating film 11a, not the insulating film 11, and therefore, dielectric breakdown is unlikely to occur between the plug 13c and the wire 20b. However, as shown in FIG. 21 etc., when the contact hole 12 and the plug 13 are formed at the position that overlaps with the part of the top surface of the laminated film 11b where the insulating film 11 is exposed, the insulating film 11 comes to neighbor and comes into contact with at least part of the top surface of the plug 13 and there arises the possibility that an electrically weak dielectric breakdown path is formed between the plug 13c and the wire 20b resulting from the insulating film 11 neighboring the plug 13c.

In contrast to this, in the present embodiment, as shown in FIG. 21, since the contact hole 12 and the plug 13 are formed at the position that overlaps with the part of the top surface of the laminated film 11b where the insulating film 11 is exposed, even if the insulating film 11 neighbors the top surface of the plug 13, the insulating film 14 is formed over the insulating film 11 that neighbors the plug 13 so that the insulating film 15 does not come into contact with the insulating film 11. By providing the insulating film 14, it is possible to prevent an electrically weak dielectric breakdown path from being formed between the plug 13c and the wire 20b, which would be formed otherwise resulting from the insulating film 11 neighboring the plug 13. Because of this, the present embodiment will be more effective when applied to the case where the contact hole 12 and the plug 13 to be embedded therein are formed at the position that overlaps with the part of the top surface of the polished and flattened laminated film 11b where the insulating film 11 is exposed in the manufacturing process of the semiconductor device, that is, the case where the insulating film 11 (that is, the part of the top surface of the laminated film 11b where the insulating film 11 is exposed) neighbors (is in contact with) (at least part of) the top surface of the plug 13 in the semiconductor device.

The present inventions by the present inventors are described specifically as above based on the embodiments, however, it is obvious that the present inventions are not limited to the embodiments and various modifications are possible in the scope not deviating from its gist.

The present invention is effective when applied to a semiconductor device having an embedded wire and its manufacturing technique.

What is claimed is:

1. A semiconductor device comprising:
   a semiconductor substrate;
   a semiconductor element formed in a main surface of the semiconductor substrate;
   a first insulating film containing silicon and oxygen formed over the main surface in which the semiconductor element of the semiconductor substrate is formed;
   a first opening formed in the first insulating film;
   a first conductor part embedded in the first opening;
   a second insulating film containing silicon and oxygen, the second insulating film having portions formed directly on and in direct contact with an upper surface of the first insulating film;
   a third insulating film containing silicon and carbon formed over the second insulating film;
   a fourth insulating film containing silicon and oxygen formed over the third insulating film;
   a wire opening formed in the second, third, and fourth insulating films; and
   a first wire embedded in the wire opening and electrically coupled with the first conductor part, at least part of a lower surface of the first wire being in direct contact with the upper surface of the first insulating film,
   wherein the second insulating film has a higher density of Si atoms than that of the first insulating film, and
   wherein the third insulating film is a SiCN film.

2. The semiconductor device according to claim 1, wherein the first and second insulating films contain silicon and oxygen as principal components.

3. The semiconductor device according to claim 1, wherein the first insulating film is a silicon oxide film, and wherein the second insulating film is a silicon oxide film or a silicon oxynitride film.

4. The semiconductor device according to claim 1, wherein the fourth insulating film is a silicon oxide film, a silicon oxynitride film, or an insulating film with a dielectric constant lower than that of a silicon oxide film.

5. The semiconductor device according to claim 1, wherein the fourth insulating film has a dielectric constant lower than a dielectric constant of the third insulating film.

6. The semiconductor device according to claim 1, wherein a thickness of the fourth insulating film is greater than a thickness of the second insulating film and a thickness of the third insulating film.

7. The semiconductor device according to claim 1, wherein the first opening is formed in the first insulating film but not in the second insulating film.

8. The semiconductor device according to claim 1, wherein the semiconductor element includes a MISFET, and wherein the first insulating film is formed over the main surface of the semiconductor substrate so that a gap between gate electrodes of the MISFET and an adjacent MISFET is filled therewith.

9. The semiconductor device according to claim 1, wherein the semiconductor element further comprises:
   a MISFET; and
   a nickel silicide layer formed over a top surface of a semiconductor region for a source or a drain of the MISFET or over a top surface of a gate electrode of the MISFET.

10. The semiconductor device according to claim 1, wherein a plurality of wire layers is formed over the semiconductor substrate, and wherein the first wire is included in a lowest layer of the wire layers.

11. The semiconductor device according to claim 1, wherein the first conductor part does not contain copper, and wherein the second insulating film includes a silicon oxide film.

12. The semiconductor device according to claim 1, wherein the first conductor part contains copper, and wherein the second insulating film includes a silicon oxynitride film.

13. The semiconductor device according to claim 1, wherein a first part of a top surface of the first conductor part is in contact with the first wire and a second part of the top surface is covered by the second insulating film.

14. The semiconductor device according to claim 1, wherein the wire opening extends to an upper surface of the first conductor part.

15. The semiconductor device according to claim 1, wherein the first conductor part is offset from the first wire by a distance.

16. The semiconductor device according to claim 1, wherein the second, third, and fourth insulating films overlap a portion of the first conductor in plan view.

17. The semiconductor device according to claim 1, further comprising:
   a fifth insulating film including a material different from that of the first insulating film formed over the main surface in which the semiconductor element of the semiconductor substrate is formed,
   wherein the first insulating film is formed over the fifth insulating film, and
   wherein the first opening is formed in a laminated film including the first and fifth insulating films.

18. A semiconductor device comprising:
   a semiconductor substrate;
   a semiconductor element formed in a main surface of the semiconductor substrate, having a source region, a drain region and a gate electrode;
   a first interlayer formed over the main surface and the semiconductor element, the first interlayer having a first insulating film containing silicon and oxygen;
   a plug formed in the first interlayer and electrically connected with the source region, the drain region or the gate electrode;

a second interlayer formed on the first interlayer, the second interlayer having a second insulating film containing silicon and oxygen, a third insulating film containing silicon and carbon formed on the second insulating film and a fourth insulating film containing silicon and oxygen formed on the third insulating film; and a wire formed in the second interlayer and electrically connected with the plug, the wire having a lower surface in contact with an upper surface of the first interlayer and an upper surface of the plug, wherein the second insulating film has a higher density of Si atoms than that of the first insulating film, and wherein the third insulating film is a SiCN film.

19. The semiconductor device according to claim 18,
wherein the first insulating film is a silicon oxide film, and
wherein the second insulating film is a silicon oxide film or a silicon oxynitride film.

20. The semiconductor device according to claim 18,
wherein the fourth insulating film is a silicon oxide film, a silicon oxynitride film, or an insulating film with a dielectric constant lower than that of a silicon oxide film.

21. The semiconductor device according to claim 18,
wherein the fourth insulating film has a dielectric constant lower than a dielectric constant of the third insulating film.

22. The semiconductor device according to claim 18,
wherein a thickness of the fourth insulating film is greater than a thickness of the second insulating film and a thickness of the third insulating film.

23. The semiconductor device according to claim 18,
wherein the semiconductor element further comprises:
a nickel silicide layer formed over a top surface of the source region or the drain region or over a top surface of the gate electrode.

24. The semiconductor device according to claim 18,
wherein the plug does not contain copper, and
wherein the second insulating film includes a silicon oxide film.

25. The semiconductor device according to claim 18,
wherein the plug contains copper, and
wherein the second insulating film includes a silicon oxynitride film.

* * * * *